(12) United States Patent
Im et al.

(10) Patent No.: US 12,261,246 B2
(45) Date of Patent: Mar. 25, 2025

(54) LIGHT EMITTING ELEMENT AND DISPLAY DEVICE INCLUDING THE SAME

(71) Applicant: Samsung Display Co., LTD., Yongin-si (KR)

(72) Inventors: Hyun Deok Im, Seoul (KR); Jong Hyuk Kang, Suwon-si (KR); Jung Hyun Ahn, Suwon-si (KR); Won Ho Lee, Suwon-si (KR); Hae Yun Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 675 days.

(21) Appl. No.: 17/494,446

(22) Filed: Oct. 5, 2021

(65) Prior Publication Data

US 2022/0131047 A1    Apr. 28, 2022

(30) Foreign Application Priority Data

Oct. 23, 2020 (KR) .......................... 10-2020-0138157

(51) Int. Cl.
*H01L 33/38* (2010.01)
*H01L 25/16* (2023.01)
(Continued)

(52) U.S. Cl.
CPC .......... *H01L 33/385* (2013.01); *H01L 25/167* (2013.01); *H01L 33/08* (2013.01);
(Continued)

(58) Field of Classification Search
CPC ..... H01L 33/385; H01L 25/167; H01L 33/08; H01L 33/20; H01L 33/62; H01L 33/36;
(Continued)

(56) References Cited

U.S. PATENT DOCUMENTS

2020/0176656 A1\* 6/2020 Bae .................... H01L 25/0753
2020/0308167 A1 10/2020 Choi et al.
(Continued)

FOREIGN PATENT DOCUMENTS

KR       10-1490758      2/2015
KR    10-2020-0010704    1/2020
(Continued)

OTHER PUBLICATIONS

International Search Report corresponding to International Application No. PCT/KR2021/014927, dated Feb. 7, 2022.
(Continued)

*Primary Examiner* — Joseph C. Nicely
*Assistant Examiner* — Alvin L Lee
(74) *Attorney, Agent, or Firm* — KILE PARK REED & HOUTTEMAN PLLC

(57) ABSTRACT

A display device comprises a first electrode and a second electrode on a substrate, a first insulating layer on the first electrode and the second electrode, light emitting elements on the first insulating layer each having a first end on the first electrode and a second end on the second electrode, a first connection electrode disposed on the first electrode and electrically contacting the first end of each of the light emitting elements, a second connection electrode disposed on the second electrode and electrically contacting the second end of each of the light emitting elements, a second insulating layer on the light emitting elements, the first connection electrode and the second connection electrode, and a third connection electrode disposed on the second insulating layer and electrically contacting the light emitting elements through an opening formed in the second insulating layer that partially exposes the light emitting elements.

15 Claims, 29 Drawing Sheets

(51) Int. Cl.
    *H01L 33/08*     (2010.01)
    *H01L 33/14*     (2010.01)
    *H01L 33/20*     (2010.01)
    *H01L 33/62*     (2010.01)

(52) U.S. Cl.
    CPC ............ *H01L 33/145* (2013.01); *H01L 33/20* (2013.01); *H01L 33/62* (2013.01)

(58) Field of Classification Search
    CPC ............ H01L 25/0753; H01L 27/1214; H01L 33/0008
    See application file for complete search history.

(56) References Cited

U.S. PATENT DOCUMENTS

2021/0288217 A1    9/2021  Li et al.
2022/0085246 A1*  3/2022  Kim ........................ H01L 33/62

FOREIGN PATENT DOCUMENTS

| | | | |
|---|---|---|---|
| KR | 10-2020-0068150 | 6/2020 | |
| KR | 10-2020-0088347 | 7/2020 | |
| KR | 10-2020-0102615 | 9/2020 | |
| KR | 10-2020-0116363 | 10/2020 | |
| WO | WO-2020149471 A1 * | 7/2020 | ........... H01L 25/167 |

OTHER PUBLICATIONS

Written Opinion corresponding to International Application No. PCT/KR2021/014927, dated Feb. 7, 2022.

\* cited by examiner

LIGHT EMITTING ELEMENT AND DISPLAY DEVICE INCLUDING THE SAME

CROSS-REFERENCE TO RELATED APPLICATION(S)

This application claims priority to and benefits of Korean Patent Application No. 10-2020-0138157 under 35 U.S.C. § 119 filed on Oct. 23, 2020 in the Korean Intellectual Property Office, the entire contents of which are incorporated herein by reference.

BACKGROUND

1. Technical Field

The disclosure relates to a light emitting element and a display device including the same.

2. Description of the Related Art

Display devices are becoming increasingly important with the development of multimedia. Accordingly, various types of display devices such as organic light emitting displays and liquid crystal displays are being used.

A display device may include a display panel such as an organic light emitting display panel or a liquid crystal display panel as a device for displaying an image of the display device. Among them, as a light emitting display panel, the display panel may include light emitting elements such as light emitting diodes (LEDs). For example, the LEDs may be organic light emitting diodes (OLEDs) using an organic material as a light emitting material or may be inorganic LEDs using an inorganic material as the light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device which can emit light regardless of orientation directions of light emitting elements.

Aspects of the disclosure also provide a light emitting element through which a current can flow in a specific or selected direction.

However, aspects of the disclosure are not restricted to the ones set forth herein. The above and other aspects of the disclosure will become more apparent to one of ordinary skill in the art to which the disclosure pertains by referencing the detailed description of the disclosure given below.

According to an embodiment, a display device may include a first electrode and a second electrode disposed on a substrate and spaced apart from each other; a first insulating layer disposed on the first electrode and the second electrode; light emitting elements disposed on the first insulating layer, each of the light emitting elements having a first end disposed on the first electrode and a second end disposed on the second electrode; a first connection electrode disposed on the first electrode and electrically contacting the first end of each of the light emitting elements, a second connection electrode disposed on the second electrode and electrically contacting the second end of each of the light emitting elements; a second insulating layer disposed on the light emitting elements, the first connection electrode and the second connection electrode; and a third connection electrode disposed on the second insulating layer and electrically contacting the light emitting elements through an opening formed in the second insulating layer that partially exposes the light emitting elements.

The first connection electrode may electrically contact an end surface of each of the light emitting elements, the second connection electrode may electrically contact another end surface of each of the light emitting elements, and the third connection electrode may electrically contact a side surface of each of the light emitting elements.

The light emitting elements may comprise first light emitting elements having first ends disposed on the first electrode and second ends disposed on the second electrode; and second light emitting elements having first ends disposed on the second electrode and second ends disposed on the first electrode.

Each of the light emitting elements may comprise a plurality of semiconductor layers and an insulating film surrounding the plurality of semiconductor layers, and the third connection electrode may electrically contact a semiconductor layer at a side of each of the light emitting elements.

Each of the light emitting elements may comprise a first semiconductor layer; a second semiconductor layer disposed on the first semiconductor layer; a light emitting layer disposed between the first semiconductor layer and the second semiconductor layer; and a third semiconductor layer disposed on a surface of the first semiconductor layer opposite a surface facing the light emitting layer. The third connection electrode may electrically contact the first semiconductor layer.

Each of the light emitting elements may further comprise a fourth semiconductor layer disposed between a portion in which the first semiconductor layer electrically contacts the third connection electrode and an end surface on which the third semiconductor layer may be disposed.

The display device may further comprise a conductive layer disposed on the first substrate; and a via layer disposed on the conductive layer, wherein the first electrode may electrically contact a first conductive pattern of the conductive layer through a first electrode contact hole penetrating the via layer, and the first connection electrode may electrically contact the first electrode through a first contact part penetrating the first insulating layer.

The second connection electrode may electrically contact a second conductive pattern of the conductive layer through a second contact part penetrating the via layer and the first insulating layer, and the third connection electrode may electrically contact a voltage wiring of the conductive layer through a third contact part penetrating the via layer, the first insulating layer and the second insulating layer.

The second electrode may electrically contact a voltage wiring of the conductive layer through a second electrode contact hole penetrating the via layer, the second connection electrode may electrically contact the first electrode through a fourth contact part penetrating the first insulating layer, and the third connection electrode may electrically contact the second electrode through a fifth contact part penetrating the first insulating layer and the second insulating layer.

The display device may further comprise a fourth connection electrode disposed on the first electrode between the first insulating layer and the second insulating layer and electrically contacting the light emitting elements; a fifth connection electrode disposed on the second electrode between the first insulating layer and the second insulating layer and electrically contacting the light emitting elements; and a sixth connection electrode disposed on the second insulating layer and electrically contacting the light emitting elements, wherein the fourth connection electrode may be spaced apart from the first connection electrode, the fifth connection electrode may be spaced apart from the second connection electrode, and the sixth connection electrode may be spaced apart from the third connection electrode.

The third connection electrode may overlap the light emitting elements that electrically contact the fourth connection electrode and the fifth connection electrode, the sixth connection electrode may overlap the light emitting elements that electrically contact the first connection electrode and the second connection electrode and contact the fourth connection electrode, and the sixth connection electrode may electrically contact the fourth connection electrode and the fifth connection electrode through sixth contact parts penetrating the second insulating layer.

The display device may further comprise a third electrode and a fourth electrode disposed on the substrate and spaced apart from each other; a fourth connection electrode disposed on the third electrode; a fifth connection electrode disposed on the fourth electrode, and a sixth connection electrode disposed on the second insulating layer, wherein the light emitting elements may comprise a first light emitting element group disposed on the first electrode and the second electrode; and a second light emitting element group disposed on the third electrode and the fourth electrode, the third connection electrode may electrically contact the second light emitting element group, and the sixth connection electrode may electrically contact the first light emitting element group.

The sixth connection electrode may further comprise an electrode extension part disposed across the second electrode, the third electrode and the fourth electrode, and the electrode extension part may electrically contact the fourth connection electrode and the fifth connection electrode through sixth contact parts penetrating the second insulating layer.

The display device may further comprise a third insulating layer disposed between the light emitting elements and the second insulating layer, wherein a portion of each of the first connection electrode and the second connection electrode may be disposed on the third insulating layer, and the opening of the second insulating layer may penetrate the third insulating layer to expose the light emitting elements.

The display device may further comprise a fourth insulating layer disposed between the second connection electrode and the second insulating layer, wherein a portion of the first connection electrode may be disposed on the fourth insulating layer, and the opening of the second insulating layer may penetrate the fourth insulating layer to expose the light emitting elements.

According to an embodiment, a light emitting element may include a first semiconductor layer doped with an n-type dopant; a second semiconductor layer disposed on the first semiconductor layer and doped with a p-type dopant; a light emitting layer disposed between the first semiconductor layer and the second semiconductor layer; a third semiconductor layer disposed on a surface of the first semiconductor layer opposite a surface facing the light emitting layer, the third semiconductor layer is undoped; and an insulating film surrounding an outer surface of at least the light emitting layer.

A length of the third semiconductor layer may be about 20% or less of a length of the light emitting element.

The light emitting element may further comprise an electron blocking layer disposed in the third semiconductor layer.

The light emitting element may further comprise an electron blocking layer disposed in the first semiconductor layer and disposed between the third semiconductor layer and the light emitting layer.

A gap between the electron blocking layer and the third semiconductor layer may be less than a gap between the electron blocking layer and the light emitting layer.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
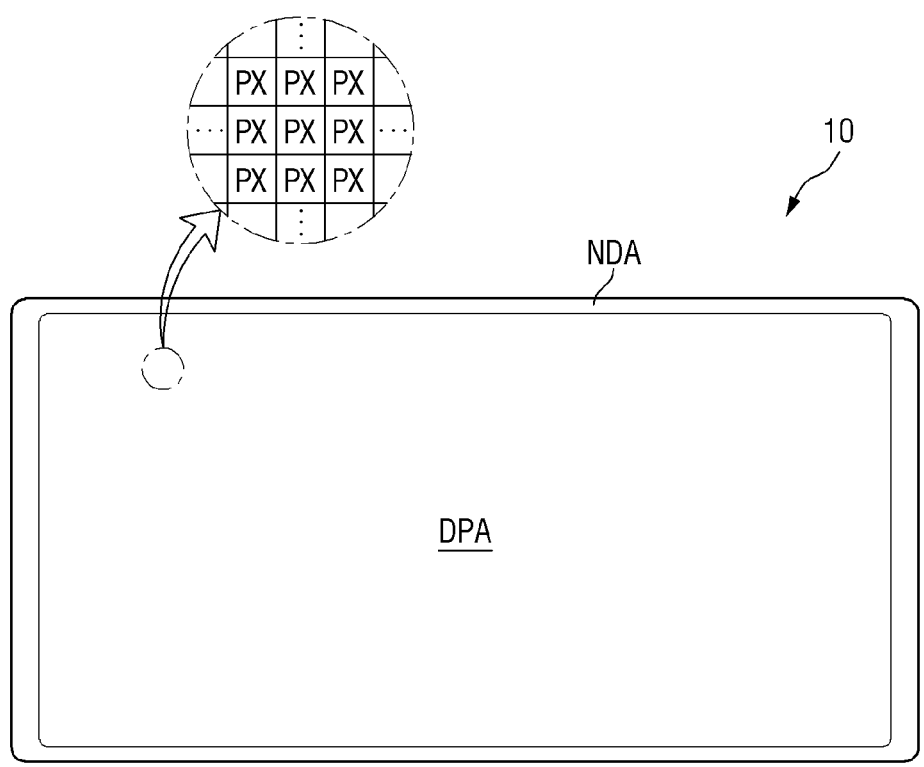
FIG. 1 is a schematic plan view of a display device according to an embodiment.
Figure 1:
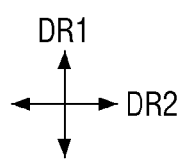

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the attached drawings.

FIG. 1 is a schematic plan view of a display device 10 according to an embodiment.

Referring to FIG. 1, the display device 10 displays moving images or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 may include a display panel that provides a display screen. Examples of the display panel include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited to this case, and other display panels can also be applied within the spirit and the scope of the disclosure.

The shape of the display device 10 can be variously modified. For example, the display device 10 may have various shapes such as a substantially horizontally long rectangle, a substantially vertically long rectangle, substantially a square, substantially a quadrangle with substantially rounded corners (vertices), other polygons, and substantially a circle. The shape of a display area DPA of the display device 10 may also be substantially similar to the overall shape of the display device 10. In FIG. 1, the display device 10 is shaped substantially like a rectangle that is long in a second direction DR2.

The display device 10 may include the display area DPA and a non-display area NDA. The display area DPA may be an area where a screen can be displayed, and the non-display area NDA may be an area where no screen is displayed. The display area DPA may also be referred to as an active area, and the non-display area NDA may also be referred to as an inactive area. The display area DPA may generally occupy the center of the display device 10.

The display area DPA may include a plurality of pixels PX. The pixels PX may be arranged or disposed in a matrix direction. Each of the pixels PX may be rectangular or square in a plan view. However, the disclosure is not limited thereto, and each of the pixels PX may also have a substantially rhombic planar shape having each side inclined with respect to a direction. The pixels PX may be alternately arranged or disposed in a stripe or PenTile® type. Each of the pixels PX may include one or more light emitting elements which may emit light of a specific or given wavelength band to display a specific or given color.

The non-display area NDA may be disposed around the display area DPA. The non-display area NDA may entirely or partially surround or may be adjacent to the display area DPA. The display area DPA may be substantially rectangular, and the non-display area NDA may be disposed adjacent to four sides of the display area DPA. The non-display area NDA may form a bezel of the display device 10. In each non-display area NDA, wirings or circuit drivers included in the display device 10 may be disposed, or external devices may be mounted.

Figure 2:
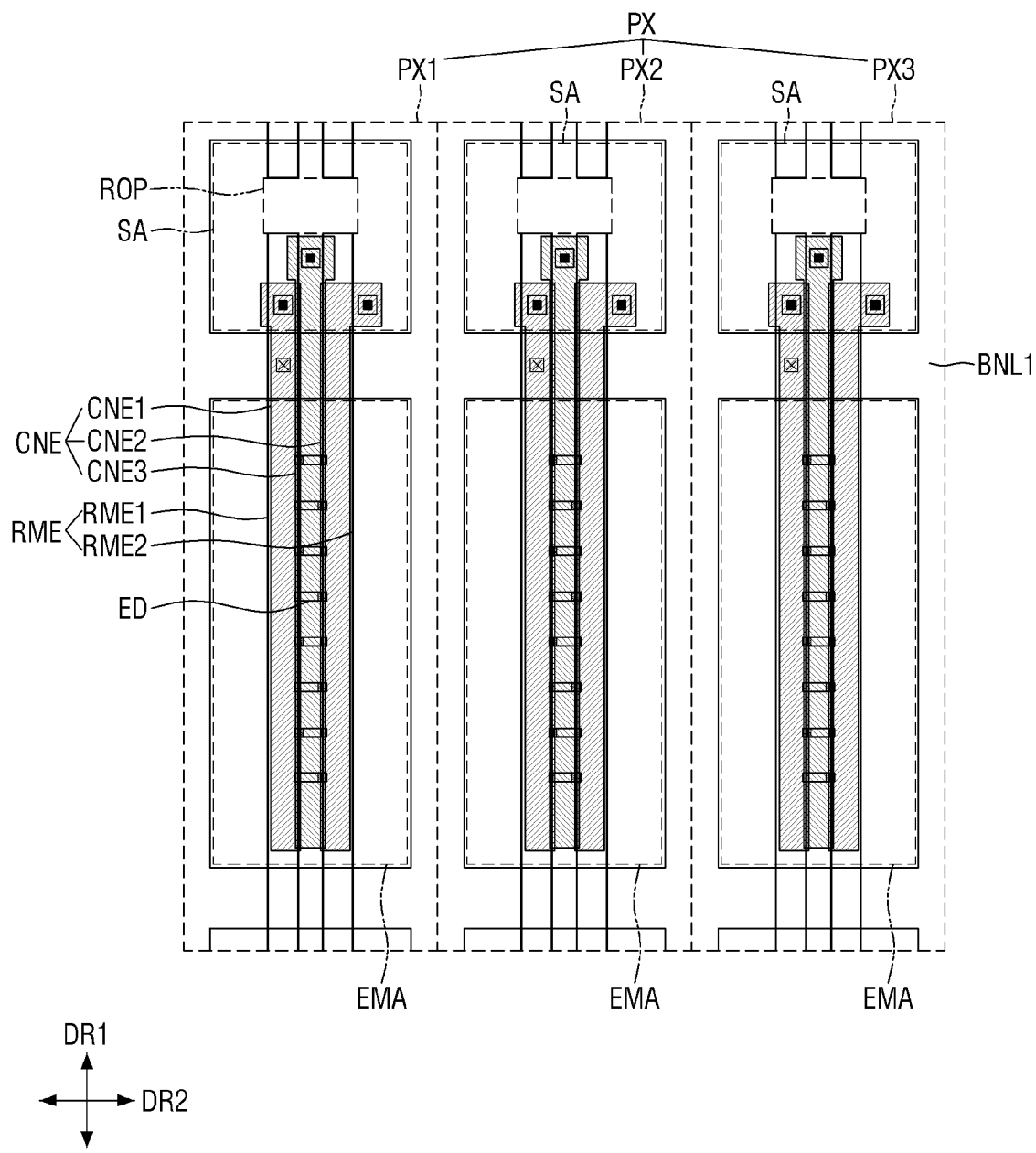
FIG. 2 is a schematic plan view of a pixel of the display device according to the embodiment.

FIG. 2 is a schematic plan view of a pixel PX of the display device 10 according to the embodiment.

Referring to FIG. 2, each of the pixels PX of the display device 10 may include a plurality of subpixels PXn (where n is 1 to 3). For example, one pixel PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. For example, the first color may be blue, the second color may be green, and the third color may be red. However, the disclosure is not limited thereto, and the subpixels PXn may also emit light of the same color. Although one pixel PX may include three subpixels PXn in FIG. 2, the disclosure is not limited thereto, and the pixel PX may also include a larger number of subpixels PXn.

Each subpixel PXn of the display device 10 may include an emission area EMA and a non-emission area (not illustrated). The emission area EMA may be an area in which light emitting elements ED are disposed to emit light of a specific or given wavelength band, and the non-emission area may be an area in which the light emitting elements ED are not disposed and from which no light is output because light emitted from the light emitting elements ED does not reach this area. The emission area may include an area in which the light emitting elements ED are disposed and an area which is adjacent to the light emitting elements ED and to which light emitted from the light emitting elements ED is output.

However, the disclosure is not limited thereto, and the emission area may also include an area from which light emitted from the light emitting elements ED is output after being reflected or refracted by other members. A plurality of light emitting elements ED may be disposed in each subpixel PXn, and an area where the light emitting elements ED are disposed and an area adjacent to this area may form the emission area.

Although the respective emission areas EMA of the subpixels PXn have substantially the same area in the drawing, the disclosure is not limited thereto. In an embodiment, the emission area EMA of each subpixel PXn may have a different area according to the color or wavelength band of light emitted from the light emitting elements ED disposed in the corresponding subpixel PXn.

Each subpixel PXn may further include a sub area SA disposed in the non-emission area. The sub area SA may be disposed on a side of the emission area EMA in a first direction DR1 and may be disposed between the emission areas EMA of subpixels PXn neighboring in the first direction DR1. For example, a plurality of emission areas EMA and a plurality of sub areas SA may be repeatedly arranged or disposed in the second direction DR2 but may be alternately arranged or disposed in the first direction DR1. A first bank BNL1 may be disposed between the sub areas SA and the emission areas EMA, and a gap between them may vary according to a width of the first bank BNL1. Light may not exit from the sub area SA because the light emitting elements ED are not disposed in the sub area SA, but parts of electrodes RME disposed in each subpixel PXn may be disposed in the sub area SA. The electrodes RME disposed in different subpixels PXn may be separated from each other in the sub area SA.

The first bank BNL1 may include parts extending in the first direction DR1 and the second direction DR2 in a plan view to form a lattice pattern over the entire display area DPA. The first bank BNL1 may be disposed at the boundary of each subpixel PXn to separate neighboring subpixels PXn. The first bank BNL1 may surround the emission area EMA and the sub area SA disposed in each subpixel PXn to separate them from each other.

Figure 3:
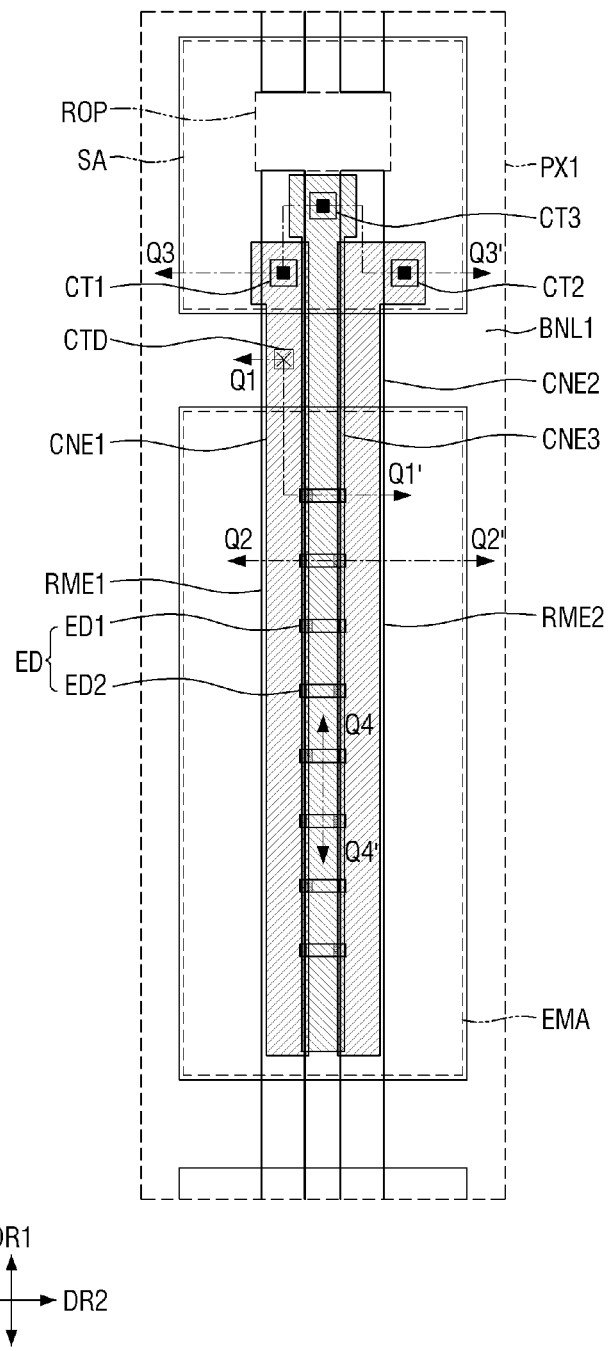
FIG. 3 is a schematic plan view of a first subpixel of FIG. 2.
Figure 4:
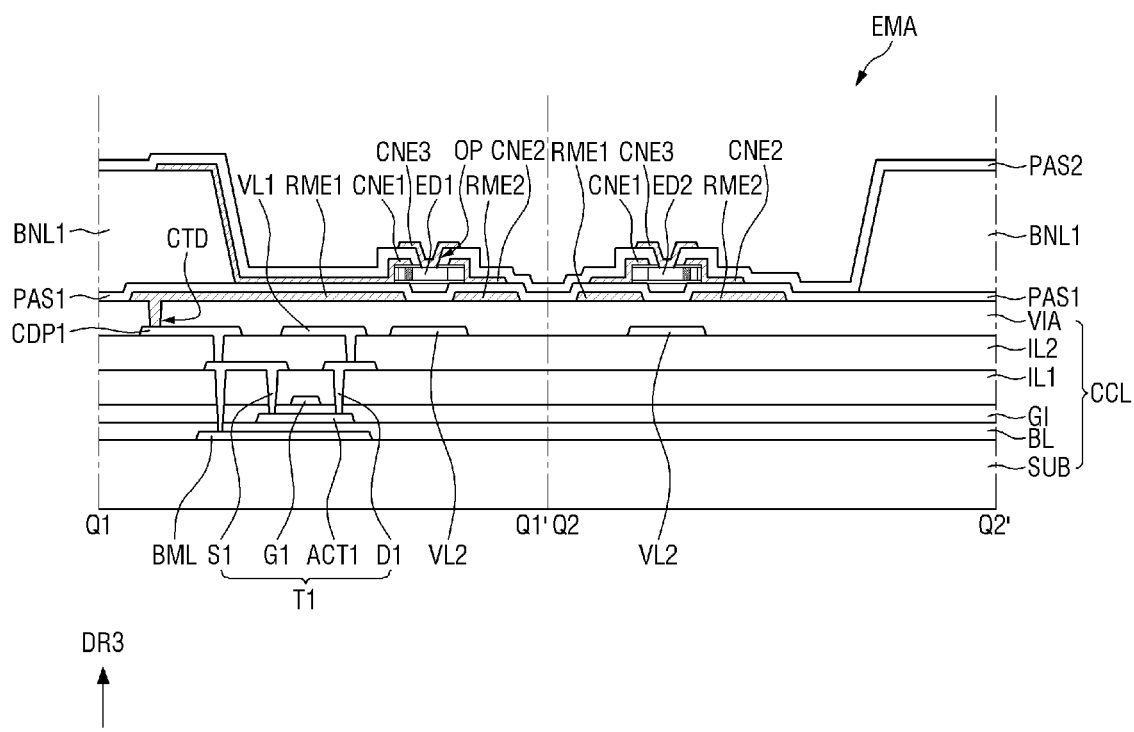
FIG. 4 is a schematic cross-sectional view taken along lines Q1-Q1' and Q2-Q2' of FIG. 3.
Figure 5:
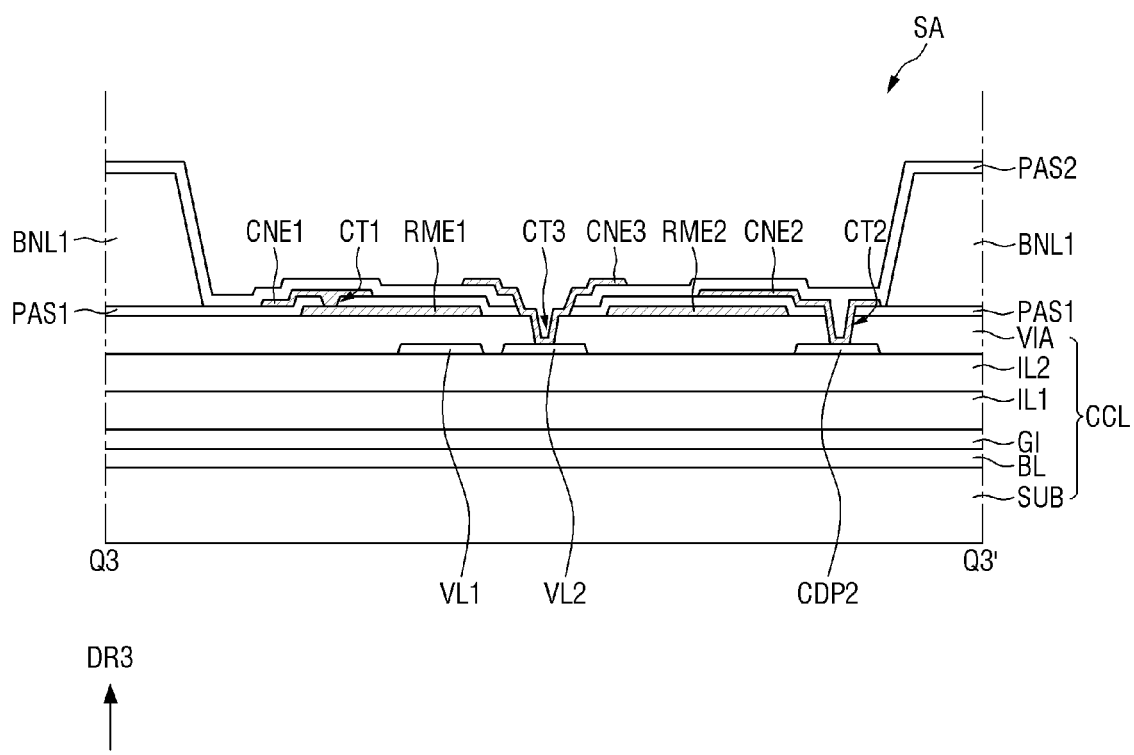
FIG. 5 is a schematic cross-sectional view taken along line Q3-Q3' of FIG. 3.

FIG. 3 is a schematic plan view of the first subpixel PX1 of FIG. 2. FIG. 4 is a schematic cross-sectional view taken along lines Q1-Q1' and Q2-Q2' of FIG. 3. FIG. 5 is a schematic cross-sectional view taken along line Q3-Q3' of FIG. 3. FIG. 3 illustrates the first subpixel PX1 included in a pixel PX, and FIG. 4 illustrates a cross section across both ends of different light emitting elements ED (ED1 and ED2) disposed in the first subpixel PX1. FIG. 5 illustrates cross sections of contact parts CT1 through CT3 through which a plurality of connection electrodes CNE may be electrically connected to the electrodes RME or an underlying conductive layer.

Referring to FIGS. 3 through 5 in conjunction with FIG. 2, the display device 10 may include a first substrate SUB and a semiconductor layer, a plurality of conductive layers and a plurality of insulating layers disposed on the first substrate SUB. The semiconductor layer, the conductive layers, and the insulating layers may constitute a circuit layer CCL and a display element layer of the display device 10.

The first substrate SUB may be an insulating substrate. The first substrate SUB may be made of an insulating material such as glass, quartz, or polymer resin. The first substrate SUB may be a rigid substrate, but may also be a flexible substrate that can be bent, folded, rolled, etc., within the spirit and the scope of the disclosure.

A first conductive layer may be disposed on the first substrate SUB. The first conductive layer may include a bottom metal layer BML, and the bottom metal layer BML is overlapped by an active layer ACT1 of a first transistor T1. The bottom metal layer BML may include a light blocking material to prevent light from entering the active layer ACT1 of the first transistor T1. However, the bottom metal layer BML may also be omitted.

A buffer layer BL may be disposed on the bottom metal layer BML and the first substrate SUB. The buffer layer BL may be formed on the first substrate SUB to protect transistors of the pixels PX from moisture introduced through the first substrate SUB which is vulnerable to moisture penetration and may perform a surface planarization function.

The semiconductor layer is disposed on the buffer layer BL. The semiconductor layer may include the active layer ACT1 of the first transistor T1. The active layer ACT1 may be partially overlapped by a gate electrode G1 of a second conductive layer which will be described later.

The semiconductor layer may include polycrystalline silicon, monocrystalline silicon, an oxide semiconductor, or the like within the spirit and the scope of the disclosure. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although one first transistor T1 is disposed in each subpixel PXn of the display device 10 in the drawings, the disclosure is not limited thereto. The display device 10 may also include a larger number of transistors.

A first gate insulating layer G1 is disposed on the semiconductor layer and the buffer layer BL. The first gate insulating layer G1 may serve as a gate insulating film of the first transistor T1.

The second conductive layer is disposed on the first gate insulating layer G1. The second conductive layer may include the gate electrode G1 of the first transistor T1. The gate electrode G1 may overlap a channel region of the active layer ACT1 in a third direction DR3 which is a thickness direction. Although not illustrated in the drawings, the second conductive layer may further include a capacitive electrode of a storage capacitor.

A first interlayer insulating layer IL1 is disposed on the second conductive layer. The first interlayer insulating layer IL1 may function as an insulating film between the second conductive layer and other layers disposed on the second conductive layer and may protect the second conductive layer.

A third conductive layer is disposed on the first interlayer insulating layer IL1. The third conductive layer may include a first source electrode S1 and a first drain electrode D1 of the first transistor T1.

The first source electrode S1 and the first drain electrode D1 of the first transistor T1 may electrically contact the active layer ACT1 respectively through contact holes penetrating the first interlayer insulating layer IL1 and the first gate insulating layer G1. The first source electrode S1 may electrically contact the bottom metal layer BML, through another contact hole penetrating the first interlayer insulating layer ILL the first gate insulating layer G1 and the buffer layer BL. Although not illustrated in the drawings, the third conductive layer may further include a plurality of data wirings or a capacitive electrode of the storage capacitor.

A second interlayer insulating layer IL2 is disposed on the third conductive layer. The second interlayer insulating layer IL2 may function as an insulating film between the third conductive layer and other layers disposed on the third conductive layer and may protect the third conductive layer.

A fourth conductive layer is disposed on the second interlayer insulating layer IL2. The fourth conductive layer may include a first voltage wiring VL1, a second voltage wiring VL2, a first conductive pattern CDP1, and a second conductive pattern CDP2. A high potential voltage (or a first power supply voltage) supplied to the first transistor T1 may be applied to the first voltage wiring VL1, and a low potential voltage (or a second power supply voltage) supplied to a third connection electrode CNE3 may be applied to the second voltage wiring VL2.

The first conductive pattern CDP1 and the second conductive pattern CDP2 may be electrically connected to the first transistor T1. The first conductive pattern CDP1 may be electrically connected to a first electrode RME1 to be described later, and the second conductive pattern CDP2 may be electrically connected to a second connection electrode CNE2. The first transistor T1 may send the first power supply voltage received from the first voltage wiring VL1 to the first electrode RME1 and the second connection electrode CNE2. However, the disclosure is not limited thereto. In an embodiment in which the second connection electrode CNE2 is electrically connected to the first electrode RME1, the second conductive pattern CDP2 may be omitted.

Each of the buffer layer BL, the first gate insulating layer G1, the first interlayer insulating layer ILL and the second interlayer insulating layer IL2 described above may be composed of a plurality of inorganic layers that may be alternately stacked each other. For example, each of the buffer layer BL, the first gate insulating layer G1, the first interlayer insulating layer ILL and the second interlayer insulating layer IL2 may be a double layer in which inorganic layers including at least any one of silicon oxide ($SiO_x$), silicon nitride ($SiN_x$) and silicon oxynitride ($SiO_xN_y$)

may be stacked each other or may be a multilayer in which the inorganic layers may be alternately stacked each other. However, the disclosure is not limited thereto, and each of the buffer layer BL, the first gate insulating layer G1, the first interlayer insulating layer ILL and the second interlayer insulating layer IL2 may also be one inorganic layer including any one of the above insulating materials. In an embodiment, the first interlayer insulating layer IL1 and the second interlayer insulating layer IL2 may be made of an organic insulating material such as polyimide (PI).

Each of the second conductive layer, the third conductive layer, and the fourth conductive layer may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

A via layer VIA is disposed on the fourth conductive layer. The via layer VIA may include an organic insulating material such as polyimide (PI) and perform a surface planarization function.

A plurality of electrodes RME, the first bank BNL1, a plurality of light emitting elements ED1 and ED2, and a plurality of connection electrodes CNE (CNE1 through CNE3) are disposed as the display element layer on the via layer VIA. A plurality of insulating layers PAS1 and PAS2 may be disposed on the via layer VIA.

The electrodes RME extend in one direction and are disposed in each subpixel PXn. The electrodes RME may extend in the first direction DR1 and may be spaced apart from each other in the second direction DR2 in each subpixel PXn.

For example, one subpixel PXn may include a plurality of electrodes RME extending in the first direction DR1 across the emission area EMA and the sub area SA. The electrodes RME of subpixels PXn neighboring in the first direction DR1 may be separated from each other in a separation part ROP of the sub area SA. In a process of manufacturing the display device 10, the electrodes RME may be formed as electrode lines extending in the first direction DR1 and utilized to generate an electric field in each subpixel PXn to align the light emitting elements ED. The light emitting elements ED may be aligned by a dielectrophoretic force due to an electric field generated on the electrode lines, and the electrode lines may be separated in the separation part ROP to form the electrodes RME.

Although the electrodes RME are spaced apart from each other in the separation part ROP of the sub area SA in the drawings, the disclosure is not limited thereto. In an embodiment, the electrodes RME disposed in each subpixel PXn may be spaced apart from each other in the separation part ROP formed in the emission area EMA. The electrodes RME may be divided into one electrode group located or disposed on a side of the separation part ROP of the emission area EMA and another electrode group located or disposed on the other or another side of the separation part ROP.

According to an embodiment, the display device 10 may include the first electrode RME1 and a second electrode RME2 disposed in each subpixel PXn. The first electrode RME1 and the second electrode RME2 may extend in the first direction DR1 on the via layer VIA and may be spaced apart from each other in the second direction DR2. The first electrode RME1 and the second electrode RME2 may have the same width, but the disclosure is not limited thereto.

The first electrode RME1 may be a first type electrode electrically connected to the fourth conductive layer disposed under or below the via layer VIA, and the second electrode RME2 may be a second type electrode not electrically connected to the fourth conductive layer. The first electrode RME1 may be electrically connected or directly electrically connected to the fourth conductive layer through a first electrode contact hole CTD formed in a part overlapping the first bank BNL1. The first electrode RME1 may electrically contact the first conductive pattern CDP1 through the first electrode contact hole CTD penetrating the via layer VIA disposed under or below the first electrode RME1. The first electrode RME1 may be electrically connected to the first transistor T1 through the first conductive pattern CDP1 to receive the first power supply voltage. Since the first electrode RME1 is disposed separately for each subpixel PXn, the light emitting elements ED of different subpixels PXn may emit light individually.

As another example, the second electrode RME2 may not be electrically connected to an underlying conductive layer and may remain floating after the alignment of the light emitting elements ED. As will be described later, an electrical signal transmitted to the second voltage wiring VL2 may be sent to the third connection electrode CNE3, and the second connection electrode CNE2 disposed on the second electrode RME2 may be electrically connected or directly electrically connected to the second conductive pattern CDP2. The second electrode RME2 may be utilized in the process of aligning the light emitting elements ED, and no electrical signal may be transmitted in case that the display device 10 is driven. While different electrical signals are respectively transmitted to the first electrode RME1 and RME2 in the alignment process of the light emitting elements ED, the same electrical signal may be transmitted to a connection electrode disposed on the first electrode RME1 and a connection electrode disposed on the second electrode RME2 in case that the display device 10 is driven. To this end, from the manufacturing process of the display device 10, the first electrode RME1 and the second electrode RME2 may be separated from each other, and the connection electrode disposed on the second electrode RME2 may be electrically connected or directly electrically connected to the conductive layer disposed under or below the via layer VIA.

However, the disclosure is not limited thereto. In an embodiment, the second electrode RME2 may also be a first type electrode electrically connected to the underlying conductive layer. Although two electrodes RME are disposed in each subpixel PXn in the drawings, the disclosure is not limited thereto. The display device 10 may also include a larger number of electrodes, for example, second type electrodes, and some or a number of the second type electrodes may remain floating while the other second type electrodes are electrically connected to connection electrodes. This will be described later with reference to other embodiments.

Some or a number of the electrodes RME may be electrically connected to the light emitting elements ED. For example, the first electrode RME1 may be electrically connected to the light emitting elements ED through a first connection electrode CNE1 which will be described later and may send an electrical signal received from the fourth conductive layer to the light emitting elements ED. An electrical signal for causing the light emitting elements ED to emit light may be transmitted or directly transmitted to the first electrode RME1. In an embodiment in which electrodes other than the first electrode RME1 and the second electrode RME2 are further included, the electrical signal may be transmitted to the electrodes through the connection electrodes CNE and the light emitting elements ED.

Each electrode RME may include a conductive material having high reflectivity. For example, each electrode RME may include a metal such as silver (Ag), copper (Cu) or aluminum (Al) as a material having high reflectivity or may be an alloy including aluminum (Al), nickel (Ni) or lanthanum (La). Each electrode RME may reflect light, which travels toward a side surface of the first bank BNL1 after being emitted from the light emitting elements ED, toward above each subpixel PXn.

However, the disclosure is not limited thereto, and each electrode RME may further include a transparent conductive material. For example, each electrode RME may include a material such as ITO, IZO or ITZO. In an embodiment, each electrode RME may have a structure in which a transparent conductive material and a metal layer having high reflectivity may be stacked each other in one or more layers or may be formed as a single layer including them. For example, each electrode RME may have a stacked structure of ITO/Ag/ITO, ITO/Ag/IZO, or ITO/Ag/ITZO/IZO.

A first insulating layer PAS1 is disposed on the via layer VIA and the electrodes RME. The first insulating layer PAS1 may entirely cover or overlap the electrodes RME and protect the electrodes RME while insulating them from each other. The first insulating layer PAS1 may prevent the light emitting elements ED disposed on the first insulating layer PAS1 from contacting or directly contacting other members and thus being damaged.

In an embodiment, the first insulating layer PAS1 may be stepped such that a part of an upper surface of the first insulating layer PAS1 is recessed between the electrodes RME spaced apart from each other in the second direction DR2. The light emitting elements ED may be disposed on the stepped upper surface of the first insulating layer PAS1, and a space may be formed between each of the light emitting elements ED and the first insulating layer PAS1. However, the disclosure is not limited thereto.

The first insulating layer PAS1 may include a plurality of contact parts (for example, a first contact part CT1 through a third contact part CT3) partially exposing upper surfaces of the electrodes RME or penetrating up to the via layer VIA. The contact parts may penetrate the first insulating layer PAS1, and the connection electrodes CNE to be described later may electrically contact the electrodes RME or the fourth conductive layer disposed under or below the via layer VIA through the contact parts.

The first bank BNL1 may be disposed on the first insulating layer PAS1. The first bank BNL1 may include parts extending in the first direction DR1 and the second direction DR2 to form a lattice pattern in a plan view. The first bank BNL1 may be disposed at the boundary of each subpixel PXn to separate neighboring subpixels PXn. The first bank BNL1 may surround the emission area EMA and the sub area SA disposed in each subpixel PXn to separate them from each other.

The first bank BNL1 may have a predetermined height and prevent ink from overflowing to adjacent subpixels PXn in an inkjet printing process during the manufacturing process of the display device 10. The first bank BNL1 may prevent inks in which different light emitting elements ED are dispersed for different subpixels PXn from being mixed with each other.

The light emitting elements ED may be disposed on the first insulating layer PAS1. Each light emitting element ED may include a plurality of layers disposed in a direction parallel to an upper surface of the first substrate SUB. The direction in which the light emitting elements ED of the display device 10 extend may be parallel to the first substrate SUB, and a plurality of semiconductor layers included in each light emitting element ED may be sequentially arranged or disposed along the direction parallel to the upper surface of the first substrate SUB. However, the disclosure is not limited thereto. In some cases, in case that the light emitting elements ED have a different structure, the layers may be arranged or disposed or located in a direction perpendicular to the first substrate SUB.

The light emitting elements ED may be spaced apart from each other along the first direction DR1 in which each electrode RME extends and may be aligned substantially parallel to each other. The light emitting elements ED may extend in a direction, and the direction in which each electrode RME extends and the direction in which the light emitting elements ED extend may be substantially perpendicular to each other. However, the disclosure is not limited thereto, and the light emitting elements ED may also extend obliquely to the direction in which each electrode RME extends.

Each light emitting element ED may include a plurality of semiconductor layers and may electrically contact the connection electrodes CNE1 through CNE3 to be described later. An insulating film 38 (see FIG. 6) may not be formed on end surfaces of each light emitting element ED in the extending direction of the light emitting element ED, thereby partially exposing the semiconductor layers. The exposed semiconductor layers may electrically contact the connection electrodes CNE. In the display device 10 according to an embodiment, a part of the insulating film 38 which may be located or disposed on side surfaces of each light emitting element ED may be removed, and some or a number of the connection electrodes CNE may be electrically connected to the side surfaces of the light emitting elements ED. Each light emitting element ED may be electrically connected to the first electrode RME1 or the conductive layers disposed under or below the via layer VIA through the connection electrodes CNE and may emit light of a specific or given wavelength band in response to an electrical signal received.

The light emitting elements ED disposed in different subpixels PXn may emit light of different wavelength bands depending on the materials that form the semiconductor layers. However, the disclosure is not limited thereto, and the light emitting elements ED disposed in different subpixels PXn may also emit light of the same color. Since each light emitting element ED may include the semiconductor layers doped with different conductivity types, it may be oriented such that an end faces a specific or selected direction by an electric field generated on the electrodes RME.

Each light emitting element ED may extend to a length greater than a gap between the first electrode RME1 and the second electrode RME2 and may be disposed such that both ends lie on the first electrode RME1 and the second electrode RME2, respectively. According to an embodiment, the display device 10 may include a plurality of light emitting elements ED (ED1 and ED2) whose respective ends face different directions. Each light emitting element ED may include a plurality of semiconductor layers, and a first end and a second end opposite the first end may be defined based on any one semiconductor layer. Each light emitting element ED may be disposed such that the first end and the second end lie on the first electrode RME1 and the second electrode RME2, respectively. However, the light emitting elements ED may be divided into different light emitting elements ED1 and ED2 according to the electrode RME1 or RME2 on which their first ends lie. For example, the light emitting elements ED may include first light emitting elements ED1 having the first ends lying on the first electrode RME1 and the second ends lying on the second electrode RME2 and second light emitting elements ED2 having the first ends lying on the second electrode RME2 and the second ends lying on the first electrode RME1. However, the disclosure is not limited thereto, and each light emitting element ED may also be disposed such that only one end lies on the electrode RME1 or RME2 according to the direction in which the light emitting element ED is oriented between the first electrode RME1 and the second electrode RME2.

Both ends of each of the first light emitting elements ED1 and the second light emitting elements ED2 may be electrically connected to different connection electrodes. The first ends of the first light emitting elements ED1 may be electrically connected to the connection electrode disposed on the first electrode RME1, and the first ends of the second light emitting elements ED2 may be electrically connected to the connection electrode disposed on the second electrode RME2. As will be described later, the connection electrodes lying on the electrodes RME1 and RME2, respectively, may be electrically connected to the first transistor T1, and the first light emitting elements ED1 and the second light emitting elements ED2 may be electrically connected to the first transistor T1 through the connection electrodes regardless of the direction in which the first ends face.

The manufacturing process of the display device 10 may include an alignment process for placing the light emitting elements ED on the electrodes RME1 and RME2. Each of the light emitting elements ED may include a plurality of semiconductor layers doped with different conductivity types and may be placed on the electrodes RME as its orientation direction and position are changed by an electric field generated on the electrodes RME1 and RME2. The orientation direction of each light emitting element ED, which is a direction in which a specific or selected end faces, may be defined according to the positions of the semiconductor layers. The orientation directions of a plurality of light emitting elements ED disposed on the electrodes RME may not be uniform. For example, similar to the first light emitting elements ED1 and the second light emitting elements ED2, the first ends of the light emitting elements ED may face different directions. If the connection electrode CNE disposed on any one electrode is electrically connected to the light emitting elements ED so that the first ends of only some or a number of light emitting elements ED (for example, only the first light emitting elements ED1) are electrically connected to the first transistor T1, some or a number of light emitting elements ED (for example, the second light emitting elements ED2) may not emit light.

The display device 10 according to the embodiment may include a connection structure between the circuit layer CCL, the connection electrodes CNE and the light emitting elements ED to enable light emission regardless of the orientation directions of the light emitting elements ED. The first electrode RME1 and the second electrode RME2 may be utilized in the alignment process of the light emitting elements ED. In case that the light emitting elements ED emit light, an electrical signal transmitted to the circuit layer CCL may be sent to the light emitting elements ED through different connection electrodes CNE. The arrangement of the connection electrodes CNE and the connection of the connection electrodes CNE to the light emitting elements ED will be described later.

A second insulating layer PAS2 is disposed on the light emitting elements ED. The second insulating layer PAS2 may be entirely disposed on the first insulating layer PAS1 and may cover or overlap the light emitting elements ED and the first bank BNL1 disposed on the first insulating layer PAS1. The second insulating layer PAS2 may cover or overlap the first and second connection electrodes CNE1 and CNE2 to be described later and may protect the first and second connection electrodes CNE1 and CNE2 while insulating them from each other. The second insulating layer PAS2 may insulate the first connection electrode CNE1 and the second connection electrode CNE2 from the third connection electrode CNE3 disposed on the second insulating layer PAS2.

According to an embodiment, the second insulating layer PAS2 may be made of a transparent insulating material. The display device 10 may include the second insulating layer PAS2 which covers or overlaps the light emitting elements ED (ED1 and ED2) and insulates the connection electrodes CNE from each other. The second insulating layer PAS2 may be made of a transparent material so that light emitted from the light emitting elements ED can exit toward above the via layer VIA.

In the second insulating layer PAS2, an opening OP partially exposing the side surfaces of the light emitting elements ED under or below the second insulating layer PAS2 and the third contact part CT3 penetrating both the first insulating layer PAS1 and the via layer VIA may be formed. The third connection electrode CNE3 to be described later may be disposed on the second insulating layer PAS2 but may be electrically connected to the light emitting elements ED and the conductive layer disposed under or below the via layer VIA through the opening OP and the third contact part CT3.

A plurality of connection electrodes CNE are disposed on the light emitting elements ED. The connection electrodes CNE may include the first and second connection electrodes CNE1 and CNE2 which are disposed on the electrodes RME1 and RME2, respectively, and disposed between the first insulating layer PAS1 and the second insulating layer PAS2 and the third connection electrode CNE3 which is disposed on the second insulating layer PAS2 to overlap the light emitting elements ED.

Each of the connection electrodes CNE may include a part extending in the first direction DR1 across the emission area EMA and the sub area SA. The first connection electrode CNE1 may be disposed on the first electrode RME1 to extend in the first direction DR1, and the second connection electrode CNE2 may be disposed on the second electrode RME2 to extend in the first direction DR1. The third connection electrode CNE3 may be disposed in a space between the first electrode RME1 and the second electrode RME2 to overlap the light emitting elements ED and may extend in the first direction DR1. The connection electrodes CNE may be disposed on the first bank BNL1 disposed between the emission area EMA and the sub area SA and may form linear patterns in each subpixel PXn. Similar to the electrodes RME, connection electrodes CNE disposed on the same layer may be spaced apart from each other in the second direction DR2. The first connection electrode CNE1 and the second connection electrode CNE2 may be spaced apart in the second direction DR2 on the light emitting elements ED.

In an embodiment, the first connection electrode CNE1 and the second connection electrode CNE2 may have the same width as the third connection electrode CNE3, and the width of the third connection electrode CNE3 may be greater than the gap between the first electrode RME1 and the second electrode RME2. The third connection electrode CNE3 may overlap the light emitting elements ED, and both side surfaces of the third connection electrode CNE3 may respectively overlap the first electrode RME1 and the second electrode RME2 in the thickness direction. In a plan view, a gap between the first connection electrode CNE1 and the second connection electrode CNE2 in the second direction DR2 may be smaller than the gap between the electrodes RME1 and RME2, and the third connection electrode CNE3 may overlap the first connection electrode CNE1 and the second connection electrode CNE2 in the thickness direction. However, since the third connection electrode CNE3 is disposed on the second insulating layer PAS2, it may not be electrically connected or not directly electrically connected to the first connection electrode CNE1 and the second connection electrode CNE2 disposed under or below the third connection electrode CNE3.

In the drawings, the connection electrodes CNE may be disposed or directly disposed on the light emitting elements ED, and the connection electrodes CNE disposed under or below the second insulating layer PAS2 are formed on substantially the same layer. However, the disclosure is not limited thereto. In an embodiment, another insulating layer may be further disposed between the light emitting elements ED and the connection electrodes CNE and between the connection electrodes CNE so that some or a number of the connection electrodes CNE are disposed on the same layer while the others are disposed on different layers.

Of each of the connection electrodes CNE, a part disposed in the emission area EMA may electrically contact the light emitting elements ED. For example, the first connection electrode CNE1 may electrically contact the first ends of the first light emitting elements ED1 and the second ends of the second light emitting elements ED2, and the second connection electrode CNE2 may electrically contact the second ends of the first light emitting elements ED1 and the first ends of the second light emitting elements ED2. The third connection electrode CNE3 may electrically contact the side surfaces of the first light emitting elements ED1 and the second light emitting elements ED2.

According to an embodiment, the second insulating layer PAS2 may include the opening OP which exposes the side surfaces of the light emitting elements ED, and the third connection electrode CNE3 may electrically contact the side surfaces of the light emitting elements ED exposed through the opening OP. The opening OP may be located or disposed in the second insulating layer PAS2 to overlap the light emitting elements ED. Although not illustrated in the drawings, the opening OP having a predetermined width may extend in the first direction DR1 between the first electrode RME1 and the second electrode RME2. The opening OP may expose the side surfaces of the light emitting elements ED but may not expose the first connection electrode CNE1 and the second connection electrode CNE2 under or below the second insulating layer PAS2. For example, the width of the opening OP may be smaller than the gap between the first connection electrode CNE1 and the second connection electrode CNE2, and the second insulating layer PAS2 may cover or overlap the first connection electrode CNE1 and the second connection electrode CNE2. The third connection electrode CNE3 may extend along the opening OP in the first direction DR1 and partially cover or overlap the exposed side surfaces of the light emitting elements ED.

The connection electrodes CNE of the display device 10 may be divided into different types of connection electrodes according to whether they are electrically connected to the electrodes RME. For example, the connection electrodes CNE may include the first connection electrode CNE1 as a first type connection electrode electrically connected or directly electrically connected to an electrode RME through a contact part formed in the first insulating layer PAS1. The connection electrodes CNE may include the second connection electrode CNE2 and the third connection electrode CNE3 as second type connection electrodes electrically connected to the underlying conductive layer through contact parts penetrating the underlying via layer VIA.

The first connection electrode CNE1 may be disposed on the first insulating layer PAS1 to overlap the first electrode RME1. The first connection electrode CNE1 may electrically contact the first electrode RME1 through the first contact part CT1 penetrating the first insulating layer PAS1 to expose an upper surface of the first electrode RME1. The second connection electrode CNE2 may be disposed on the first insulating layer PAS1 to overlap the second electrode RME2. However, the second connection electrode CNE2 may not electrically contact the second electrode RME2 and may electrically contact the second conductive pattern CDP2 through the second contact part CT2 penetrating the first insulating layer PAS1 and the via layer VIA to expose the second conductive pattern CDP2 of the fourth conductive layer.

As described above, since the first electrode RME1 may be electrically connected to the first conductive pattern CDP1, the first connection electrode CNE1 and the second connection electrode CNE2 may be electrically connected to the first transistor T1 through different conductive patterns CDP1 and CDP2, respectively. The first power supply voltage applied to the first voltage wiring VL1 and the first transistor T1 may be transferred to the first connection electrode CNE1 and the second connection electrode CNE2 through the first conductive pattern CDP1 and the second conductive pattern CDP2, respectively. The first power supply voltage is applied to the first ends of the first light emitting elements ED1 through the first connection electrode CNE1 and applied to the first ends of the second light emitting elements ED2 through the second connection electrode CNE2. For example, in the display device 10, the first power supply voltage may be applied to the first ends of the light emitting elements ED regardless of the orientation directions of the light emitting elements ED. The flow of the first power supply voltage applied to the second ends of the light emitting elements ED may be blocked by any one semiconductor layer of each light emitting element ED. Accordingly, of the first power supply voltage applied to the first connection electrode CNE1 and the second connection electrode CNE2, only the voltage applied to the first ends of the light emitting elements ED may flow through the light emitting elements ED.

The third connection electrode CNE3 may be disposed on the second insulating layer PAS2 to overlap the light emitting elements ED and may electrically contact the side surfaces of the light emitting elements ED exposed through the opening OP of the second insulating layer PAS2. Different from other connection electrodes, only a part of the third connection electrode CNE3 may overlap the electrodes RME1 and RME2, and the third connection electrode CNE3 may electrically contact the second voltage wiring VL2 of the fourth conductive layer through the third contact part CT3 penetrating the second insulating layer PAS2, the first insulating layer PAS1 and the via layer VIA. The second power supply voltage applied to the second voltage wiring VL2 may be transferred to the third connection electrode CNE3 and applied to the side surfaces of the first light emitting elements ED1 and the second light emitting elements ED2. Even if the light emitting elements ED are oriented in random directions, a specific or selected part of the side surfaces of the light emitting elements ED may be exposed by the opening OP of the second insulating layer PAS2 regardless of the types of the light emitting elements ED. The light emitting elements ED may receive the second power supply voltage, which is applied to the third connection electrode CNE3, through the exposed side surfaces, and a current flowing to the light emitting elements ED may flow along the first ends and side surfaces of the light emitting elements ED. The first light emitting elements ED1 and the second light emitting elements ED2 may allow currents received respectively from the first connection electrode CNE1 and the second connection electrode CNE2 to flow to the same third connection electrode CNE3 and may be connected in parallel.

The first connection electrode CNE1 which is a first type connection electrode may transmit an electrical signal, which is transmitted to the first electrode RME1, to the light emitting elements ED, and the second connection electrode CNE2 and the third connection electrode CNE3 which are second type connection electrodes may transmit an electrical signal, which is transmitted to the conductive layer under or below the via layer VIA, indirectly or directly to the light emitting elements ED.

The contact parts CT1 through CT3 may not overlap the light emitting elements ED in the second direction DR2. Each of the contact parts CT1 through CT3 may be spaced apart in the first direction DR1 from an area where the light emitting elements ED are disposed. In an embodiment, the contact parts CT1 through CT3 may be formed in the sub area SA in which the light emitting elements ED are not disposed. Since the contact parts CT1 through CT3 are disposed in the sub area SA, it is possible to minimize light emitted from the light emitting elements ED from being refracted by the contact parts CT1 through CT3 and thus failing to be emitted to the outside. It is possible to prevent the light emitting elements ED from clustering around the contact parts CT1 through CT3 in the manufacturing process of the display device 10 due to the contact parts CT1 through CT3 exposing the upper surfaces of the electrodes RME.

The connection electrodes CNE may include a conductive material such as ITO, IZO, ITZO, or aluminum (Al). For example, the connection electrodes CNE may include a transparent conductive material, and light emitted from the light emitting elements ED may pass through the connection electrodes CNE and proceed toward the electrodes RME, but the disclosure is not limited thereto.

Although not illustrated in the drawings, an insulating layer may be further disposed on the connection electrodes CNE to cover or overlap them. The insulating layer may be entirely disposed on the first substrate SUB to protect the members disposed on the first substrate SUB from the external environment.

Each of the first insulating layer PAS1 and the second insulating layer PAS2 described above may include, but is not limited to, an inorganic insulating material or an organic insulating material.

Even if the display device 10 according to the embodiment may include the light emitting elements ED oriented in different directions, it can make the light emitting elements ED emit light through the connection electrodes CNE regardless of the orientation directions of the light emitting elements ED. In the display device 10, a light emission rate of the light emitting elements ED disposed per unit area may increase, thereby improving the yield of the manufacturing process.

Figure 6:
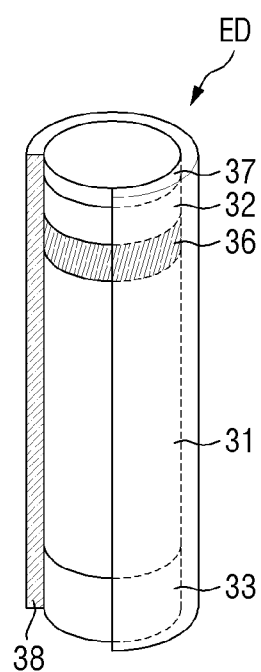
FIG. 6 is a schematic view of a light emitting element according to an embodiment.
Figure 7:
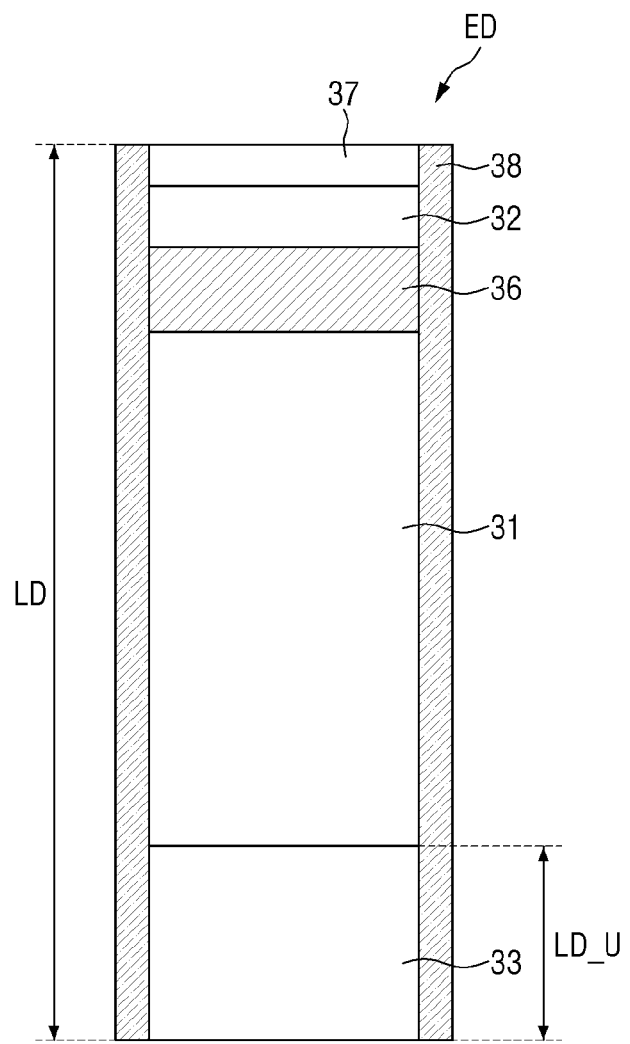
FIG. 7 is a schematic cross-sectional view of the light emitting element of FIG. 6.

FIG. 6 is a schematic view of a light emitting element ED according to an embodiment. FIG. 7 is a schematic cross-sectional view of the light emitting element ED of FIG. 6. FIG. 7 illustrates a schematic cross section of the light emitting element ED cut in a longitudinal direction.

Referring to FIGS. 6 and 7, the light emitting element ED may be a light emitting diode. For example, the light emitting element ED may be an inorganic light emitting diode having a size of nanometers to micrometers and made of an inorganic material. In case that an electric field is formed in a specific or selected direction between two electrodes facing each other, the light emitting element ED may be aligned between the two electrodes in which polarities are formed.

The light emitting element ED according to the embodiment may extend in one direction. The light emitting element ED may be substantially shaped like a cylinder, a rod, a wire, a tube, or the like within the spirit and the scope of the disclosure. However, the shape of the light emitting element ED is not limited thereto, and the light emitting element ED may also have various shapes including substantially polygonal prisms, such as a cube, a rectangular parallelepiped and a hexagonal prism, and a shape substantially extending in a direction and having a partially inclined outer surface.

The light emitting element ED may include a semiconductor layer doped with impurities of any conductivity type (for example, a p type or an n type). The semiconductor layer may receive an electrical signal from an external power source and emit light of a specific or given wavelength band. The light emitting element ED may include a first semiconductor layer 31, a second semiconductor layer 32, a third semiconductor layer 33, a light emitting layer 36, an electrode layer 37, and the insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of n-type doped AlGaInN, GaN, AlGaN, InGaN, AlN, and InN. An n-type dopant used to dope the first semiconductor layer 31 may be Si, Ge, Sn, or the like within the spirit and the scope of the disclosure.

The second semiconductor layer 32 is disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of p-type doped AlGaInN, GaN, AlGaN, InGaN, AlN, and InN. A p-type dopant used to dope the second semiconductor layer 32 may be Mg, Zn, Ca, Se, Ba, or the like within the spirit and the scope of the disclosure.

Although each of the first semiconductor layer 31 and the second semiconductor layer 32 is composed of one layer in the drawing, the disclosure is not limited thereto. Each of the first semiconductor layer 31 and the second semiconductor layer 32 may also include a larger number of layers, for example, may further include a clad layer or a tensile strain barrier reducing (TSBR) layer depending on the material of the light emitting layer 36.

The light emitting layer 36 is disposed between the first semiconductor layer 31 and the second semiconductor layer 32. The light emitting layer 36 may include a material having a single or multiple quantum well structure. In case that the light emitting layer 36 may include a material having a multiple quantum well structure, it may have a structure in which a plurality of quantum layers and a plurality of well layers may be alternately stacked each other. The light emitting layer 36 may emit light through combination of electron-hole pairs according to electrical signals received through the first semiconductor layer 31 and the second semiconductor layer 32. The light emitting layer 36 may include a material such as AlGaN or AlGaInN. In case that the light emitting layer 36 has a multiple quantum well structure in which a quantum layer and a well layer may be alternately stacked each other, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy may be alternately stacked each other or may include different group 3 to 5 semiconductor materials depending on the wavelength band of light that it emits. Light emitted from the light emitting layer 36 is not limited to light in a blue wavelength band. In some cases, the light emitting layer 36 may emit light in a red or green wavelength band.

The third semiconductor layer 33 may be a semiconductor undoped with a dopant. The third semiconductor layer 33 may include substantially the same semiconductor material as the first semiconductor layer 31 but may not be n-type doped, different from the first semiconductor layer 31. For example, the third semiconductor layer 33 may be any one or more of undoped AlGaInN, GaN, AlGaN, InGaN, AlN, and InN.

In an embodiment, the third semiconductor layer 33 may be disposed on a surface of the first semiconductor layer 31 which is opposite the other surface facing the light emitting layer 36. In the drawing, the third semiconductor layer 33 may be disposed on a lower surface of the first semiconductor layer 31 and may be a part exposed on an end surface of the light emitting element ED. Both ends of the light emitting element ED may be parts in which the second semiconductor layer 32 and the third semiconductor layer 33 are disposed, respectively, and the first power supply voltage applied through the first connection electrode CNE1 or the second connection electrode CNE2 may be transmitted to the second semiconductor layer 32 or the third semiconductor layer 33 of the light emitting element ED. Different from the second semiconductor layer 32, since the third semiconductor layer 33 may include a semiconductor material not doped with a dopant, a current due to the first power supply voltage may not flow. Accordingly, even if the first power supply voltage is applied from both ends of the light emitting element ED, a current may flow in a direction only through a specific or selected end.

A length LD_U of the third semiconductor layer 33 may be about 20% or less of a length LD of the light emitting element ED. If the length LD_U of the third semiconductor layer 33 is too short, a current due to the first power supply voltage applied to the third semiconductor layer 33 may leak. If the length LD_U is too long, there may occur a connection failure between the light emitting element ED and the connection electrodes CNE. For example, if a part of the light emitting element ED which may be electrically connected to the third connection electrode CNE3 is the third semiconductor layer 33, a current due to the second power supply voltage may also not flow, thus making the light emitting element ED unable to emit light. The third semiconductor layer 33 may have a length that enables it to block a current flowing to the light emitting element ED and takes connection to the third connection electrode CNE3 into consideration. For example, the length LD_U of the third semiconductor layer 33 may be, but is not limited to 1 μm or less.

The electrode layer 37 may be an ohmic contact electrode. However, the disclosure is not limited thereto, and the electrode layer 37 may also be a Schottky connection electrode. The light emitting element ED may include at least one electrode layer 37. The light emitting element ED may include one or more electrode layers 37. However, the disclosure is not limited thereto, and the electrode layer 37 may also be omitted.

In case that the light emitting element ED is electrically connected to an electrode or a connection electrode in the display device 10, the electrode layer 37 may reduce the resistance between the light emitting element ED and the electrode or the connection electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO).

The insulating film 38 surrounds outer surfaces of the semiconductor layers and the electrode layer described above. For example, the insulating film 38 may surround an outer surface of at least the light emitting layer 36 but may expose both ends of the light emitting element ED in the longitudinal direction. An upper surface of the insulating film 38 may be rounded in cross section in an area adjacent to at least one end of the light emitting element ED.

The insulating film 38 may include a material having insulating properties, such as silicon oxide ($SiO_x$), silicon nitride ($SiN_x$), silicon oxynitride ($SiO_xN_y$), aluminum nitride ($AlN_x$), or aluminum oxide ($AlO_x$). Although the insulating film 38 is illustrated as a single layer in the drawing, the disclosure is not limited thereto. In an embodiment, the insulating film 38 may be formed in a multilayer structure in which a plurality of layers may be stacked each other.

The insulating film 38 may protect the above members. The insulating film 38 may prevent an electrical short circuit that may occur in the light emitting layer 36 in case that the light emitting layer 36 electrically contacts or directly electrically contacts an electrode through which an electrical signal is transmitted to the light emitting element ED. The insulating film 38 may prevent a reduction in luminous efficiency of the light emitting element ED.

An outer surface of the insulating film 38 may be treated. A plurality of light emitting elements ED may be sprayed onto electrodes in a state where they are dispersed in a predetermined ink and then may be aligned. Here, the surface of the insulating film 38 may be hydrophobic or hydrophilic-treated so that each light emitting element ED remains separate from other adjacent light emitting elements ED in the ink without being agglomerated with them.

In the display device 10, a side surface of the light emitting element ED exposed through the opening OP of the second insulating layer PAS2 may be a part in which the first semiconductor layer 31 is disposed. The opening OP may penetrate a part of the insulating film 38 of the light emitting element ED as well as the second insulating layer PAS2 and may expose or directly expose the first semiconductor layer 31. In an embodiment, the third connection electrode CNE3 of the display device 10 may electrically contact or directly electrically contact the first semiconductor layer 31 exposed on the side surface of the light emitting element ED.

Figure 8:
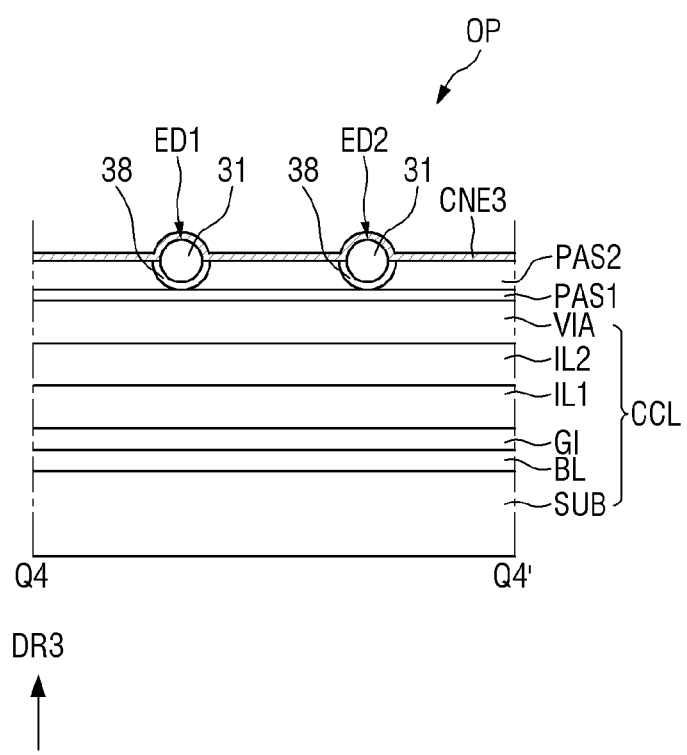
FIG. 8 is a schematic cross-sectional view taken along line Q4-Q4' of FIG. 3.

FIG. 8 is a schematic cross-sectional view taken along line Q4-Q4' of FIG. 3. FIG. 8 illustrates a schematic cross section taken across the middle of a plurality of light emitting elements ED between the electrodes RME in the first direction DR1 in which the opening OP extends.

Referring to FIG. 8, the second insulating layer PAS2 may cover or overlap the light emitting elements ED but may include the opening OP partially exposing the side surfaces of the light emitting elements ED. In a process of forming the opening OP, the insulating films 38 of the light emitting elements ED may also be partially removed together with the second insulating layer PAS2. Similar to the insulating films 38 of the light emitting elements ED, the second insulating layer PAS2 may include an inorganic insulating material. Thus, the insulating films 38 may also be partially removed in the process of forming the opening OP. Accordingly, the opening OP may expose or directly expose the first semiconductor layers 31 of the light emitting elements ED. A part of the third connection electrode CNE3 which is disposed in the opening OP may electrically contact or directly electrically contact the first semiconductor layers 31 of the light emitting elements ED, and the second power supply voltage may be applied to the first semiconductor layers 31 of the light emitting elements ED through the third connection electrode CNE3.

A part of each light emitting element ED which is exposed by the opening OP may be the first semiconductor layer 31 regardless of the orientation direction of the light emitting element ED. In each light emitting element ED, the first semiconductor layer 31 may be longer than the light emitting layer 36, the second semiconductor layer 32 and the third semiconductor layer 33 and may be located or disposed in the middle of the light emitting element ED disposed on the electrodes RME. Although the respective first ends of a first light emitting element ED1 and a second light emitting element ED2 face different directions, since a part electrically connected to the third connection electrode CNE3 is the first semiconductor layer 31, a current due to a power supply voltage may flow in a specific or selected direction.

In FIG. 8, the opening OP is formed by removing only a part of the second insulating layer PAS2. A part of the second insulating layer PAS2 in which the opening OP may be located or disposed may have a smaller thickness than other parts, and the insulating films 38 covered or overlapped by the second insulating layer PAS2 may not be removed. For example, in each light emitting element ED, only an upper part of the insulating film 38 in cross section may be removed, and only an upper part of the first semiconductor layer 31 in cross section may be exposed. The third connection electrode CNE3 may extend in the first direction DR1 in a part of the second insulating layer PAS2 in which the opening OP may be located or disposed and may cover or overlap the second insulating layer PAS2 and the light emitting elements ED.

However, the disclosure is not limited thereto, and the opening OP may also be formed to completely penetrate the second insulating layer PAS2, and a side part of the first semiconductor layer 31 may be exposed in addition to the upper part in cross section.

Figure 9:
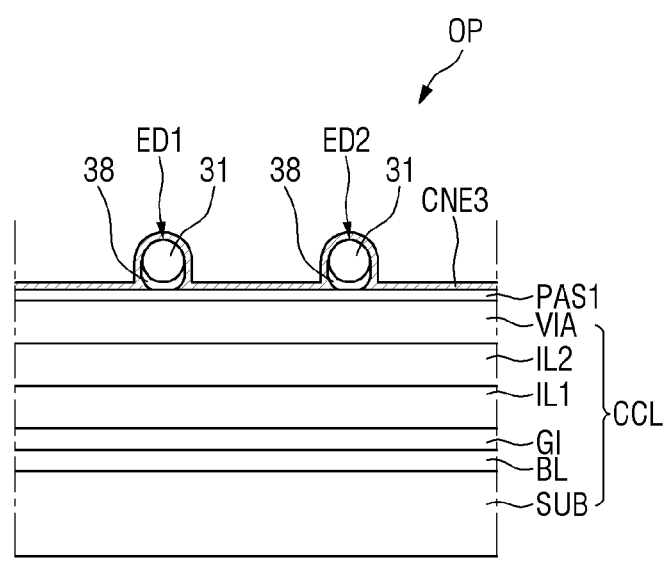
FIG. 9 is a schematic cross-sectional view illustrating the arrangement of light emitting elements and a third connection electrode of a display device according to an embodiment.

FIG. 9 is a schematic cross-sectional view illustrating the arrangement of light emitting elements ED and a third connection electrode CNE3 of a display device 10 according to an embodiment.

Referring to FIG. 9 together with FIG. 8, an opening OP may penetrate a second insulating layer PAS2 to expose a first insulating layer PAS1 disposed under or below the second insulating layer PAS2, and most of an insulating film 38 of each light emitting element ED may be removed by the opening OP. In each light emitting element ED, only the insulating film 38 located or disposed in a lower part of a semiconductor layer in cross section may remain, and both upper and side parts of a first semiconductor layer 31 may be exposed. The third connection electrode CNE3 may cover or overlap the first semiconductor layers 31 exposed in the opening OP and may contact or directly contact the first insulating layer PAS1 exposed by the opening OP. The structures of the openings OP illustrated in FIGS. 8 and 9 may vary according to conditions of a process of removing a part of the second insulating layer PAS2.

In each light emitting element ED disposed in the display device 10, the first semiconductor layer 31 may be electrically connected to the third connection electrode CNE3, and each of a second semiconductor layer 32 and a third semiconductor layer 33 at both ends may be electrically connected to a first connection electrode CNE1 or a second connection electrode CNE2. In an embodiment, in each light emitting element ED of the display device 10, a first end may be a part in which the second semiconductor layer 32 is disposed with respect to a light emitting layer 36, and a second end may be a part in which a third semiconductor layer 33 is disposed with respect to the light emitting layer 36. Since the third semiconductor layer 33 of each light emitting element ED may include an undoped semiconductor material, no current may flow even if the third semiconductor layer 33 may be electrically connected to a connection electrode CNE. Accordingly, even if both ends of each light emitting element ED are respectively electrically connected to the connection electrodes CNE1 and CNE2 electrically connected to a first transistor T1, a current may flow only in a specific or selected direction.

Figure 10:
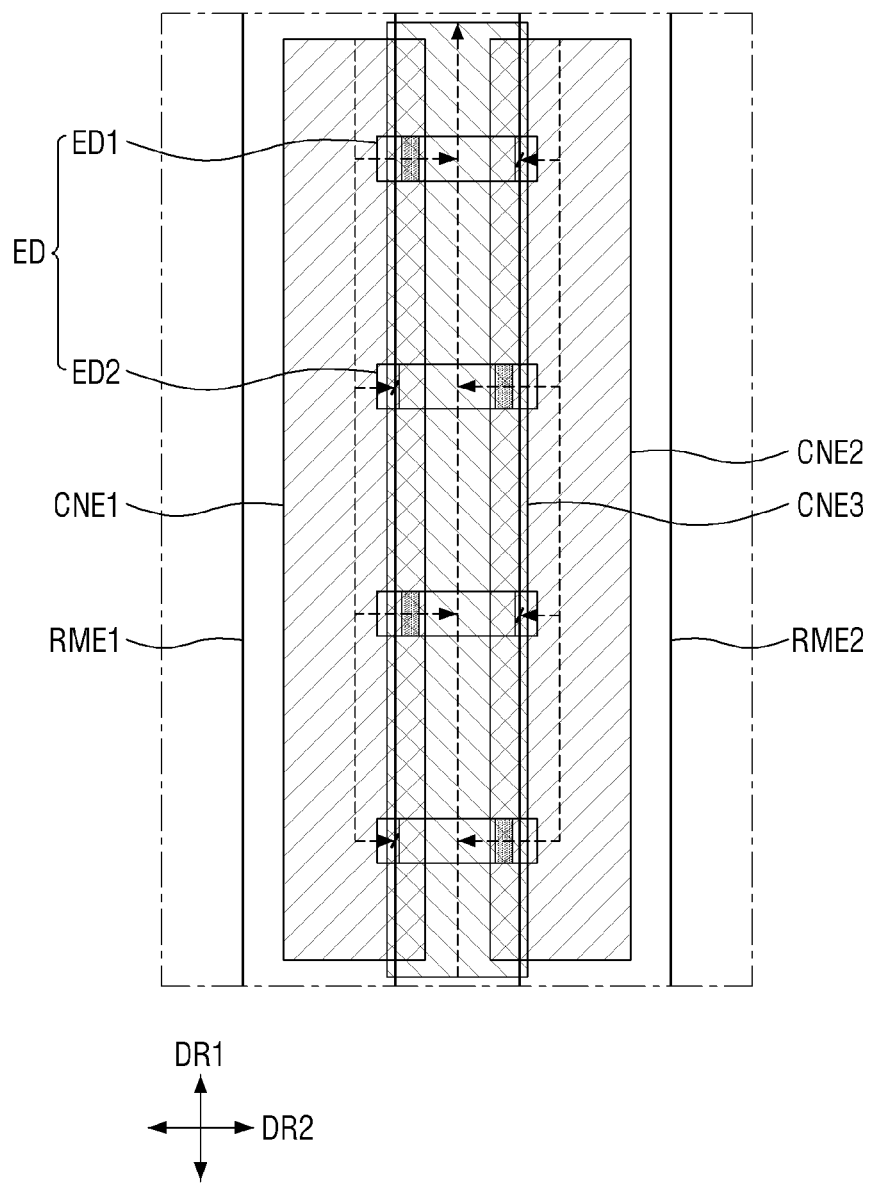
FIG. 10 is a schematic view illustrating the flow of a current for causing light emitting elements of the display device according to the embodiment to emit light.

FIG. 10 is a schematic view illustrating, the flow of a current for causing the light emitting elements ED of the display device 10 according to the embodiment to emit light. FIG. 10 schematically illustrates the arrangement of the electrodes RME1 and RME2, the connection electrodes CNE1 through CNE3, and the light emitting elements ED.

Referring to FIG. 10, in the display device 10, the first power supply voltage may be applied to each of the first connection electrode CNE1 and the second connection electrode CNE2, and the second power supply voltage may be applied to the third connection electrode CNE3. A current due to the first power supply voltage and the second power supply voltage may flow to the light emitting elements ED and may flow from the first connection electrode CNE1 and the second connection electrode CNE2 to the third connection electrode CND. The first power supply voltage may be transmitted to the first ends or the second ends of the light emitting elements ED, and the current may flow to the first ends or the second ends of the light emitting elements ED. The first ends of the first light emitting elements ED1 may be disposed on the first electrode RME1 so that the current can flow from the first connection electrode CNE1, and the second ends of the first light emitting elements ED1 may be disposed on the second electrode RME2 so that the current can flow from the second connection electrode CNE2. On the other hand, the first ends of the second light emitting elements ED2 may be disposed on the second electrode RN E2 so that the current can flow from the second connection electrode CNE2, and the second ends of the second light emitting elements ED2 may be disposed on the first electrode RME1 so that the current can flow from the first connection electrode CNE1. As described above, a part of each light emitting element ED in which the second semiconductor layer 32 is disposed may be defined as the first end, and a part in which the third semiconductor layer 33 is disposed may be defined as the second end. A current flowing to both ends of each light emitting element ED may flow to the light emitting layer 36 only through the second semiconductor layer 32 which is a p-type semiconductor layer and not through the third semiconductor layer 33 which is an undoped semiconductor layer. For example, a current flowing from the first connection electrode CNE1 may flow to the light emitting layer 36 in each first light emitting element ED1, and a current flowing from the second connection electrode CNE2 may flow to the light emitting layer 36 in each second light emitting element ED2. The current flowing to the light emitting layer 36 may flow to the third connection electrode CNE3 through the first semiconductor layer 31 regardless of the first light emitting elements ED1 and the second light emitting elements ED2. Each light emitting element ED may emit light of a specific or given wavelength band from the light emitting layer 36 according to the flow of the current.

The display device 10 according to the embodiment may include the light emitting elements ED, to each of which a current flows only through a specific or selected end, and a plurality of connection electrodes CNE which may be electrically connected to different semiconductor layers of each light emitting element ED. In the display device 10, the light emitting elements ED can be made to emit light regardless of the orientation directions of the light emitting elements ED, and the number of light emitting elements that may not emit light per unit area can be minimized, thereby improving the yield of the manufacturing process.

Hereinafter, various embodiments of the display device 10 will be described with further reference to other drawings.

Figure 11:
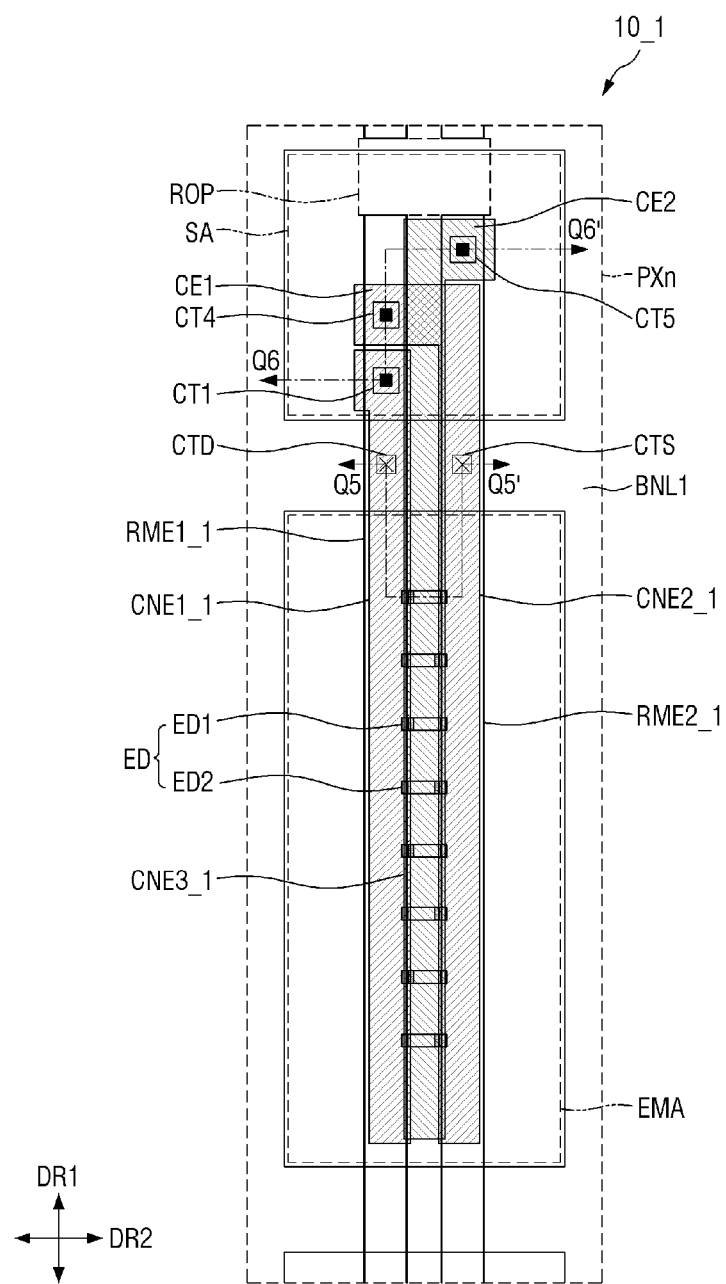
FIG. 11 is a schematic plan view of a subpixel of a display device according to an embodiment.
Figure 12:
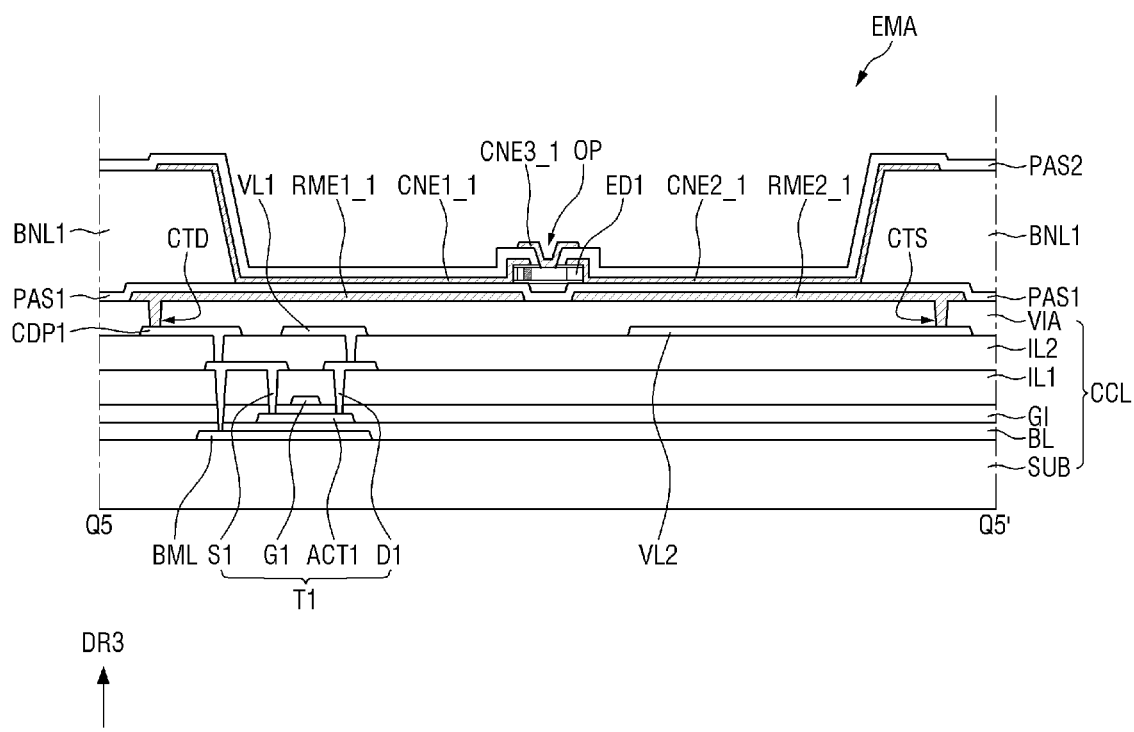
FIG. 12 is a schematic cross-sectional view taken along line Q5-Q5' of FIG. 11.
Figure 13:
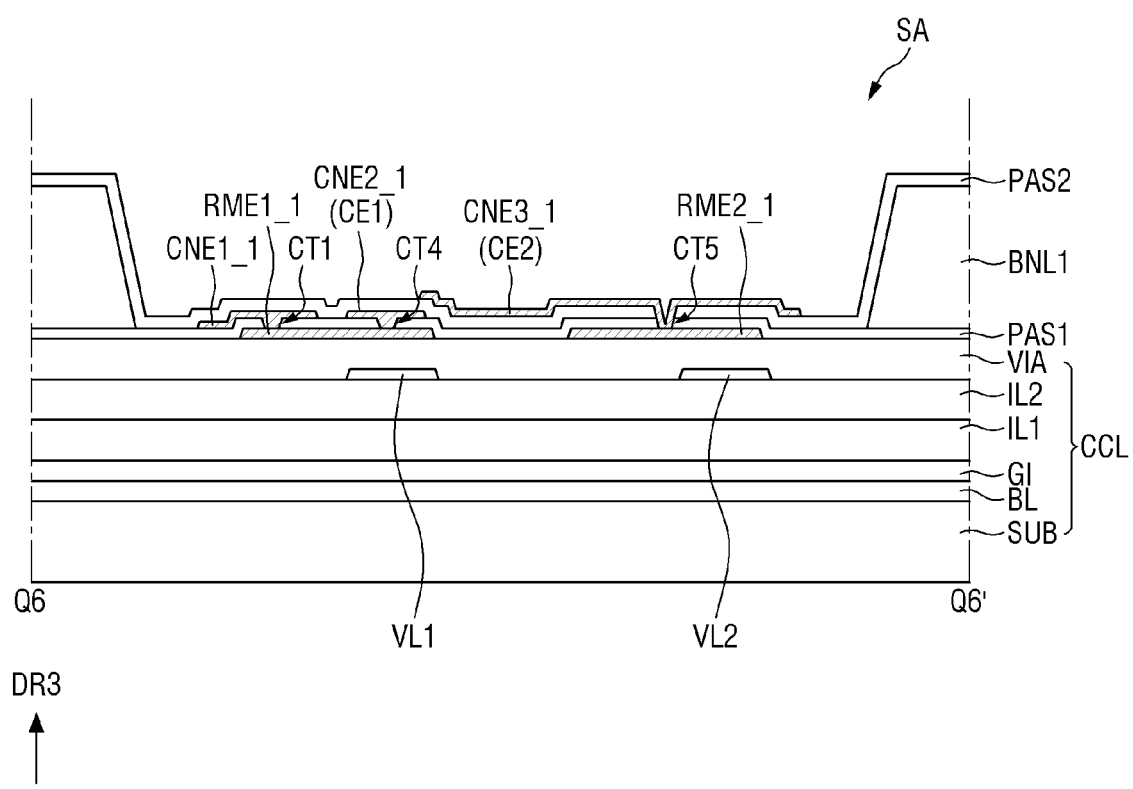
FIG. 13 is a schematic cross-sectional view taken along line Q6-Q6' of FIG. 11.

FIG. 11 is a schematic plan view of a subpixel of a display device 10_1 according to an embodiment. FIG. 12 is a schematic cross-sectional view taken along line Q5-Q5' of FIG. 11. FIG. 13 is a schematic cross-sectional view taken along line Q6-Q6' of FIG. 11. FIG. 12 illustrates a part of the display device 10_1 across both ends of a light emitting element ED, in which electrodes RME1_1 and RME2_1 may be electrically connected to a conductive layer under or below the electrodes RME1_1 and RME2_1. FIG. 13 illustrates a schematic cross section across a plurality of contact parts CT1, CT4 and CT5.

Referring to FIGS. 11 through 13, in the display device 10_1 according to the embodiment, a second voltage wiring VL2 may be electrically connected to a second electrode RME2_1, and a third connection electrode CNE3_1 may be electrically connected to the second voltage wiring VL2 through the second electrode RME2_1. Similar to a first connection electrode CNE1_1, a second connection electrode CNE2_1 may be electrically connected to a first transistor T1 through a first electrode RME1_1. The display device 10_1 according to the current embodiment is different from the embodiment of FIG. 3 in the arrangement of the connection electrodes CNE for making light emitting elements ED emit light regardless of orientation directions of the light emitting elements ED.

Similar to the first electrode RME1_1, the second electrode RME2_1 may be a first type electrode electrically connected to a fourth conductive layer under or below the second electrode RME2_1. The second electrode RME2_1 may be electrically connected or directly electrically connected to the fourth conductive layer under or below a via layer VIA through a second electrode contact hole CTS formed in a part overlapping a first bank BNL1. The second electrode RME2_1 may electrically contact the second voltage wiring VL2 through the second electrode contact hole CTS penetrating the via layer VIA under or below the second electrode RME2_1. The second electrode RME2_1 may electrically contact the second voltage wiring VL2 through the second electrode contact hole CTS penetrating the via layer VIA under or below the second electrode RME2_1. Since the second electrode RME2_1 is disposed separately for each subpixel PXn, the light emitting elements ED of different subpixels PXn may emit light individually.

The first connection electrode CNE1_1 may be electrically connected to the first electrode RME1_1 through a first contact part CT1 as in the embodiment of FIG. 3. The second connection electrode CNE2_1 may be disposed on the second electrode RME2_1 but, like the first connection electrode CNE1_1, may be electrically connected to the first electrode RME1_1. According to an embodiment, the second connection electrode CNE2_1 may be disposed on the second electrode RME2_1 but may further include a first electrode extension part CE1 disposed in a sub area SA, and the first electrode extension part CE1 may be disposed on the first electrode RME1_1. The second connection electrode CNE2_1 may electrically contact the first electrode RME1_1 through a fourth contact part CT4 penetrating a first insulating layer PAS1 and may be electrically connected to the first transistor T1 through the first electrode RME1_1. Since the second connection electrode CNE2_1 may be electrically connected to the first electrode RME1_1, a second conductive pattern CDP2 of the fourth conductive layer may be omitted.

A first power supply voltage may be applied to the second connection electrode CNE2_1 through a first voltage wiring VL1, and a second power supply voltage may be applied to the second electrode RME2_1 under or below the second connection electrode CNE2_1 through the second voltage wiring VL2. However, since the first insulating layer PAS1 is disposed between the second electrode RME2_1 and the second connection electrode CNE2_1, a short circuit between them may not occur even if different electrical signals are transmitted to the second electrode RME2_1 and the second connection electrode CNE2_1, respectively.

The third connection electrode CNE3_1 may overlap an area between the first electrode RME1_1 and the second electrode RME2_1 but may be electrically connected to the second electrode RME2_1. According to an embodiment, the third connection electrode CNE3_1 may extend in the first direction DR1 in the area between the first electrode RME1_1 and the second electrode RME2_1 but may further include a second electrode extension part CE2 disposed in the sub area SA, and the second electrode extension part CE2 may be disposed on the second electrode RME2_1. The third connection electrode CNE3_1 may electrically contact the second electrode RME2_1 through a fifth contact part CT5 penetrating the first insulating layer PAS1 and a second insulating layer PAS2 and may be electrically connected to the second voltage wiring VL2 through the second electrode RME2_1. Since the third connection electrode CNE3_1 may be electrically connected to the second electrode RME2_1, a third contact part CT3 penetrating the second insulating layer PAS2, the first insulating layer PAS1 and the via layer VIA may be omitted.

In the display device 10_1, the arrangement of the connection electrodes CNE and the connection of the connection electrodes CNE to the electrodes RME may be variously changed to make the light emitting elements ED emit light regardless of the orientation directions of the light emitting elements ED. In the display device 10_1 according to the current embodiment, since the second electrode RME2_1 is electrically connected to the second voltage wiring VL2, there is no electrode remaining floating in each subpixel PXn, and each electrode RME may be a first type electrode electrically connected to the fourth conductive layer. Since a floating electrode disposed in each subpixel PXn is omitted, the display device 10_1 is free from the problem of formation of unwanted parasitic capacitance.

Figure 14:
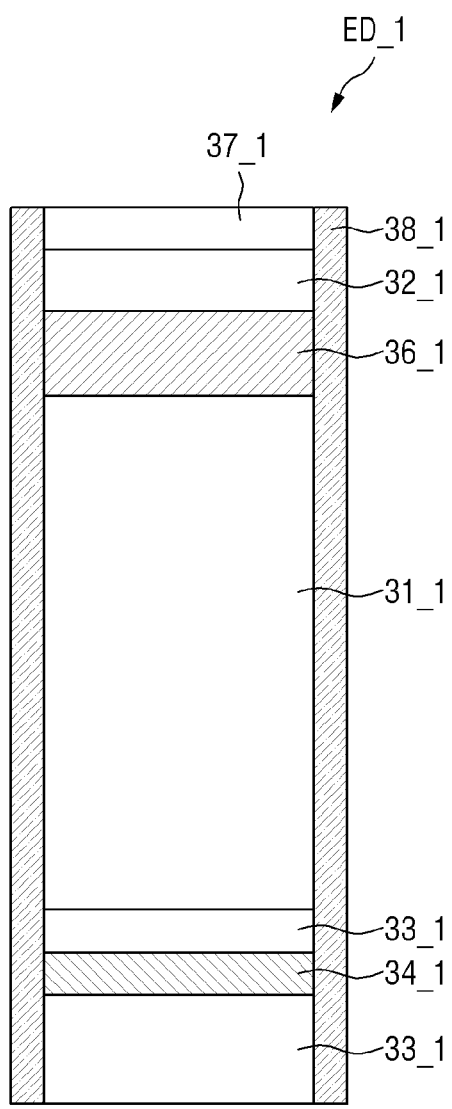
FIG. 14 is a schematic cross-sectional view of a light emitting element according to an embodiment.

FIG. 14 is a schematic cross-sectional view of a light emitting element ED_1 according to an embodiment.

Referring to FIG. 14, the light emitting element ED_1 according to the embodiment may further include a fourth semiconductor layer 34_1 inserted into a third semiconductor layer 33_1. The light emitting element ED_1 may include the third semiconductor layer 33_1, which is an undoped semiconductor layer, to prevent a current from flowing to a second end of the light emitting element ED_1 disposed in a display device 10. To more effectively prevent the flow of a current through the third semiconductor layer 33_1, the light emitting element ED_1 according to the embodiment may further include the fourth semiconductor layer 34_1 functioning as an electron blocking layer. The current embodiment is different from the embodiment of FIG. 7 in that the light emitting element ED_1 further may include the fourth semiconductor layer 34_1. A first semiconductor layer 311, a second semiconductor layer 32_1, a light emitting layer 36_1, an electrode layer 37_1, and an insulating film 38_1 are the same as those described above. Thus, the fourth semiconductor layer 34_1 will be described in detail below.

The fourth semiconductor layer 34_1 may prevent a current supplied through the third semiconductor layer 33_1, which is the second end of the light emitting element ED_1, from flowing to the first semiconductor layer 31_1. Similar to the third semiconductor layer 33_1, the fourth semiconductor layer 34_1 may include a semiconductor material undoped with a dopant. For example, the fourth semiconductor layer 34_1 may be any one or more of AlGaInN, GaN, AlGaN, InGaN, AlN, and InN. The fourth semiconductor layer 34_1 may include a material having a higher band gap energy than the first semiconductor layer 31_1 and the third semiconductor layer 33_1 to prevent electrons injected into the third semiconductor layer 331 from flowing to the first semiconductor layer 31_1.

Although the fourth semiconductor layer 34_1 is inserted into the third semiconductor layer 33_1 and spaced apart from the first semiconductor layer 31_1 in the drawing, the disclosure is not limited thereto. In an embodiment, the fourth semiconductor layer 34_1 may be disposed in another semiconductor layer but may be spaced apart from the light emitting layer 361 between the light emitting layer 36_1 and the third semiconductor layer 33_1.

Figure 15:
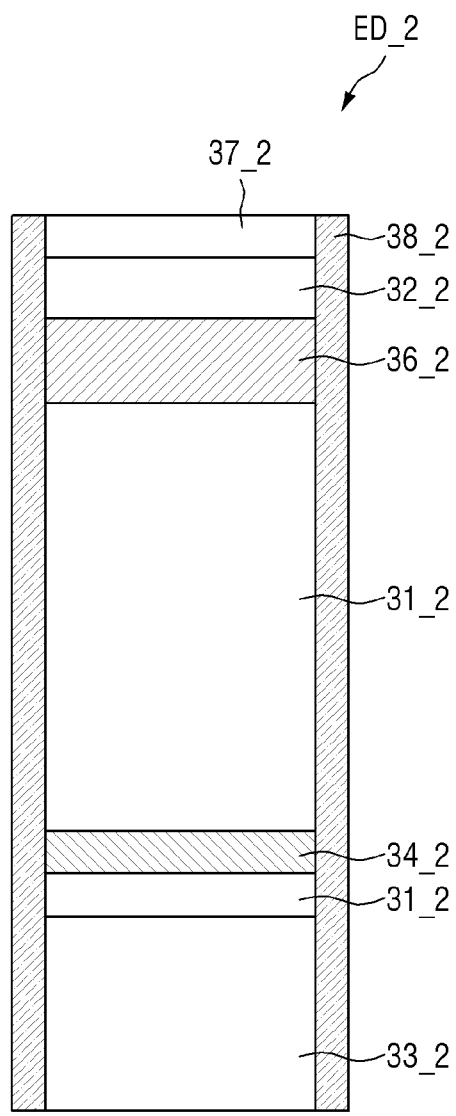
FIG. 15 is a schematic cross-sectional view of a light emitting element according to an embodiment.

FIG. 15 is a schematic cross-sectional view of a light emitting element ED_2 according to an embodiment.

Referring to FIG. 15, in the light emitting element ED_2 according to the embodiment, a fourth semiconductor layer 34_2 may be inserted into a first semiconductor layer 31_2. The fourth semiconductor layer 34_2 functioning as an electron blocking layer may prevent electrons injected into a third semiconductor layer 33_2 from flowing to a third connection electrode CNE3 through the first semiconductor layer 31_2. The fourth semiconductor layer 34_2 may be disposed adjacent to a second end at which the third semiconductor layer 33_2 may be disposed. For example, a gap between the fourth semiconductor layer 34_2 and the third semiconductor layer 33_2 may be smaller than a gap between the fourth semiconductor layer 34_2 and a light emitting layer 36_2.

If a part in which the third connection electrode CNE3 and the first semiconductor layer 31_2 electrically contact each other is located or disposed between the fourth semiconductor layer 34_2 and a light emitting layer 36_2 based on a part in which the light emitting element ED_2 electrically contacts the third connection electrode CNE3 in a display device 10, the fourth semiconductor layer 34_2 may be inserted into the first semiconductor layer 312. In the light emitting element ED_2 of FIG. 15, the fourth semiconductor layer 342 may be inserted into the first semiconductor layer 31_2. In the display device 10, the fourth semiconductor layer 34_2 may be disposed between a part of the first semiconductor layer 31_2, which is exposed by an opening OP, and the third semiconductor layer 33_2. However, the disclosure is not limited thereto, and the fourth semiconductor layer 34_2 may also be disposed between the first semiconductor layer 31_2 and the third semiconductor layer 33_2.

In the light emitting element ED_2 according to the embodiment, the fourth semiconductor layer 34_2 functioning as an electron blocking layer may be spaced apart from the light emitting layer 36_2 with a part electrically contacting the third connection electrode CNE3 interposed between them. The fourth semiconductor layer 34_2 of the light emitting element ED_2 may prevent electrons injected into the third semiconductor layer 33_2 from flowing to the third connection electrode CNE3 and prevent a short circuit caused by a current leaking from the second end of the light emitting element ED_2 in the display device 10. FIG. 15 also includes a second semiconductor layer 322, electrode layers 37_2, and insulating film 38_2.

Figure 16:
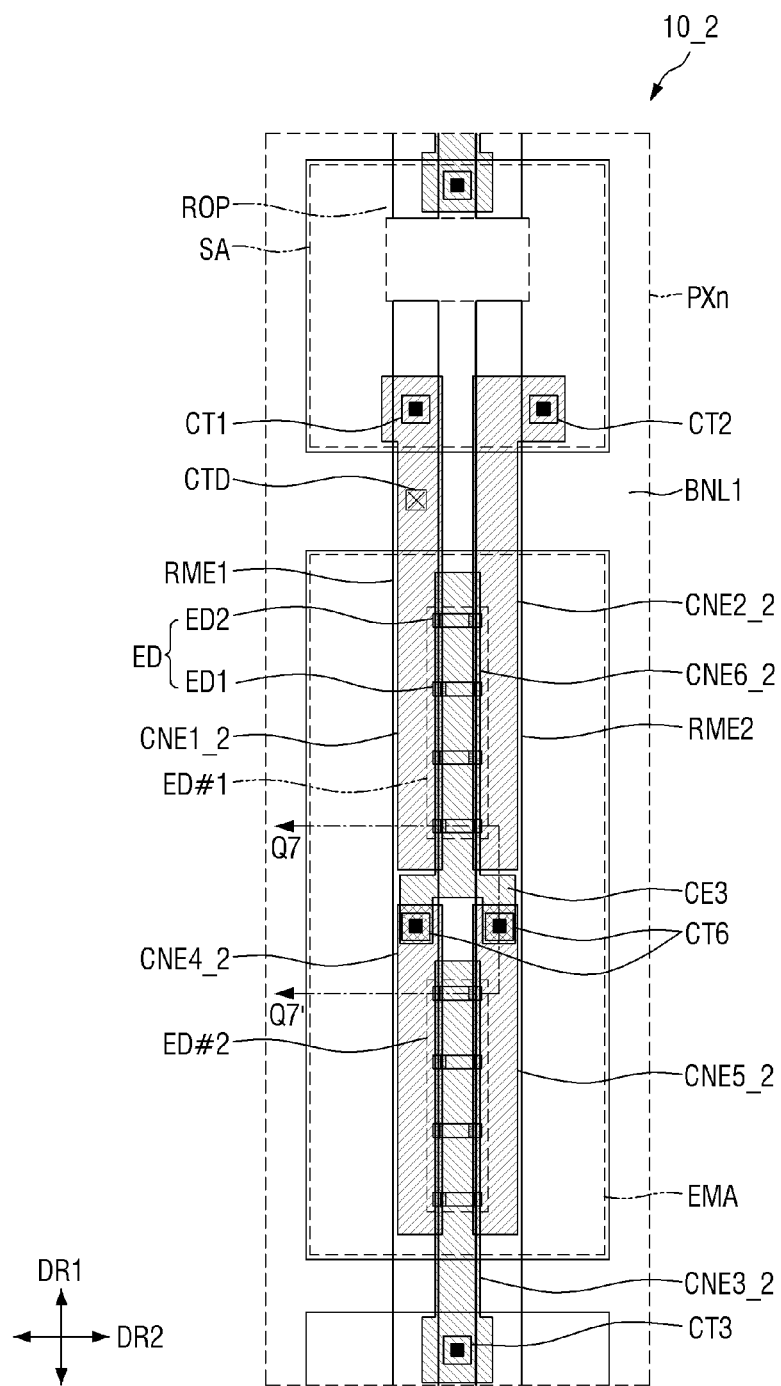
FIG. 16 is a schematic plan view of a subpixel of a display device according to an embodiment.
Figure 17:
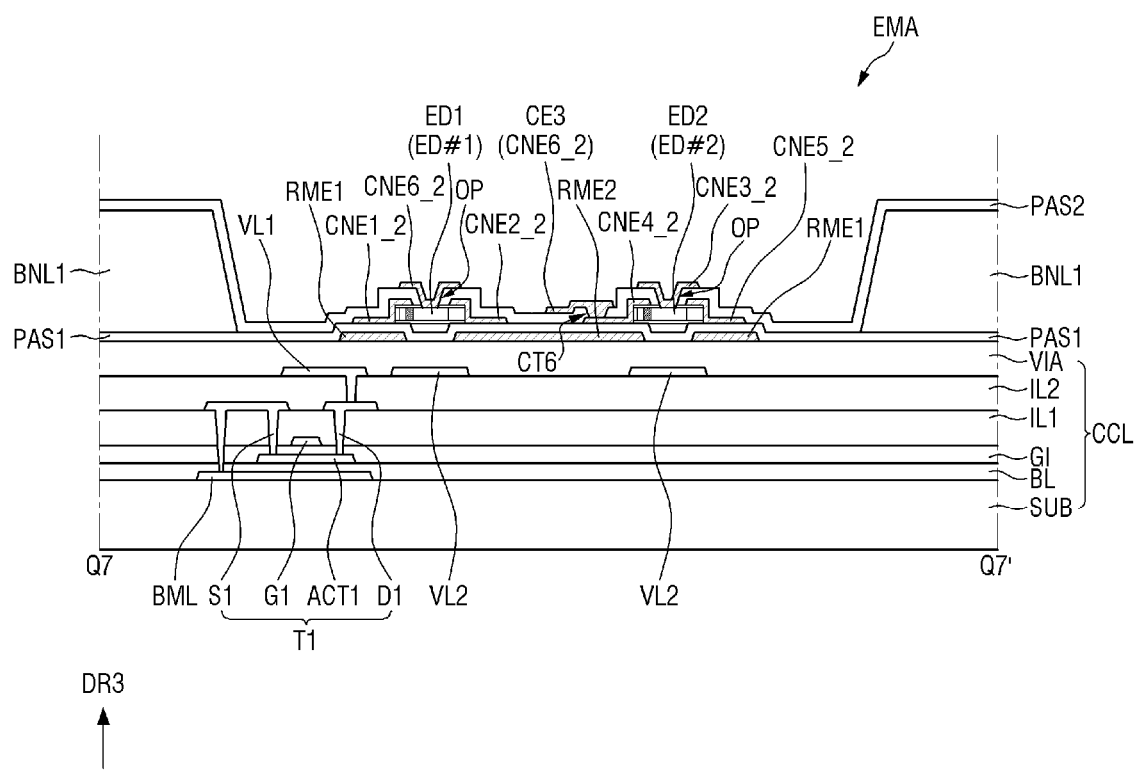
FIG. 17 is a schematic cross-sectional view taken along line Q7-Q7' of FIG. 16.

FIG. 16 is a schematic plan view of a subpixel of a display device 10_2 according to an embodiment. FIG. 17 is a schematic cross-sectional view taken along line Q7-Q7' of FIG. 16. FIG. 17 illustrates a schematic cross section across both ends of light emitting elements ED of different light emitting element groups ED #1 and ED #2.

Referring to FIGS. 16 and 17, in the display device 10_2 according to the embodiment, each subpixel PXn may include a larger number of connection electrodes CNE. The light emitting elements ED disposed in one subpixel PXn may be divided into different light emitting element groups ED #1 and ED #2 according to electrically connected connection electrodes CNE, and different light emitting element groups ED #1 and ED #2 may be electrically connected to each other through the connection electrodes CNE.

The connection electrodes CNE of the display device 10_2 may include fourth through sixth connection electrodes CNE4_2, CNE5_2 and CNE6_2 in addition to first through third connection electrodes CNE1_2, CNE2_2 and CNE3_2.

The first connection electrode CNE1_2 and the second connection electrode CNE2_2 may be disposed on a first electrode RME1 and a second electrode RME2, respectively, as in the embodiment of FIG. 3. The first connection electrode CNE1_2 and the second connection electrode CNE2_2 may electrically contact the first electrode RME1 and a second conductive pattern CDP2 through a first contact part CT1 and a second contact part CT2, respectively. The first connection electrode CNE1_2 and the second connection electrode CNE2_2 may be disposed between a first insulating layer PAS1 and a second insulating layer PAS2 and may electrically contact some or a number of (for example, light emitting elements ED of a first light emitting element group ED #1) of the light emitting elements ED disposed in each subpixel PXn. Different from the embodiment of FIG. 3, the first connection electrode CNE1_2 and the second connection electrode CNE2_2 may have a relatively short length in the first direction DR1 and may not electrically contact some or a number of light emitting elements ED (for example, light emitting elements ED of a second light emitting element group ED #2).

The fourth connection electrode CNE4_2 and the fifth connection electrode CNE5_2 may be disposed on the first electrode RME1 and the second electrode RME2, respectively. The fourth connection electrode CNE4_2 may be spaced apart from the first connection electrode CNE1_2 in the first direction DR1, and the fifth connection electrode CNE5_2 may be spaced apart from the second connection electrode CNE2_2 in the first direction DR1. Different from the first connection electrode CNE1_2 and the second connection electrode CNE2_2, the fourth connection electrode CNE4_2 and the fifth connection electrode CNE5_2 may not be electrically connected or not directly electrically connected to the electrodes RME1 and RME2 or conductive layers under or below them. The fourth connection electrode CNE4_2 and the fifth connection electrode CNE5_2 may be disposed between the first insulating layer PAS1 and the second insulating layer PAS2 and may electrically contact light emitting elements (for example, the light emitting elements ED of the second light emitting element group ED #2) which may not electrically contact the first connection electrode CNE1_2 and the second connection electrode CNE2_2 among the light emitting elements ED disposed in each subpixel PXn.

According to an embodiment, the display device 10_2 may include first type connection electrodes electrically connected or directly electrically connected to electrodes RME disposed under or below the first insulating layer PAS1, second type connection electrodes electrically connected or directly electrically connected to a conductive layer disposed under or below a via layer VIA, and third type connection electrodes not electrically connected or not directly electrically connected. The first connection electrode CNE1_2 and the second connection electrode CNE2_2 may be a first type connection electrode and a second type connection electrode, respectively, and the fourth connection electrode CNE4_2 and the fifth connection electrode CNE5_2 may be third type connection electrodes which electrically contact only the light emitting elements ED. A power supply voltage applied from a first voltage wiring VL1 and a second voltage wiring VL2 may not be transferred or not directly transferred to the fourth connection electrode CNE4_2 and the fifth connection electrode CNE5_2 but may be transferred to them from the light emitting elements ED or other types of connection electrodes. A third type connection electrode may provide a path through which a current flows to make the light emitting elements ED emit light.

According to an embodiment, one subpixel PXn of the display device 10_2 may include the light emitting element groups ED #1 and ED #2 distinguished from each other according types of connection electrodes that both ends of the light emitting elements ED contact. For example, one subpixel PXn may include the first light emitting element group ED #1 in which both ends of light emitting elements ED are disposed on the first electrode RME1 and the second electrode RME2 and electrically contact the first connection electrode CNE1_2 and the second connection electrode CNE2_2 and the second light emitting element group ED #2 in which both ends of light emitting elements ED are disposed on the first electrode RME1 and the second electrode RME2 and electrically contact the fourth connection electrode CNE4_2 and the fifth connection electrode CNE5_2. The light emitting elements ED of each light emitting element group ED #1 or ED #2 may include first light emitting elements ED1 and second light emitting elements ED2 distinguished according to the direction in which first ends face.

The light emitting element groups ED #1 and ED #2 may each be formed by a plurality of light emitting elements ED arranged or disposed relatively adjacent to each other and may be disposed at different positions in an emission area EMA. For example, in one subpixel PXn, the first light emitting element group ED #1 may be disposed on a side of the center of the emission area EMA in the first direction DR1, and the second light emitting element group ED #2 may be disposed on the other side of the center of the emission area EMA in the first direction DR1. The first light emitting element group ED #1 and the second light emitting element group ED #2 may be spaced apart from each other in the first direction DR1. A gap between the light emitting elements ED in each light emitting element group ED #1 or ED #2 may be smaller than a distance between the light emitting elements ED of different light emitting element groups ED #1 and ED #2. However, the light emitting element groups ED #1 and ED #2 may also not be objectively distinguished as described above but may be distinguished according to relative positions in the emission area EMA and types of electrically connected connection electrodes CNE.

As described above, both ends of the light emitting elements ED of the first light emitting element group ED #1 and the second light emitting element group ED #2 may be electrically connected to different connection electrodes CNE. Similarly, the light emitting elements ED of different light emitting element groups ED #1 and ED #2 may electrically contact different connection electrodes disposed on the second insulating layer PAS2.

The third connection electrode CNE3_2 may overlap the light emitting elements ED of the second light emitting element group ED #2 and may electrically contact the second light emitting element group ED #2 exposed through an opening OP formed in the second insulating layer PAS2. The third connection electrode CNE3_2 may extend to a sub area SA of another subpixel PXn neighboring in the first direction DR1 and may electrically contact the second voltage wiring VL2 through a third contact part CT3 formed in the sub area SA of the another subpixel PXn. The third connection electrode CNE3_2 may be a second type connection electrode.

The sixth connection electrode CNE6_2 may be disposed on the second insulating layer PAS2 and spaced apart from the third connection electrode CNE3_2 in the first direction DR1. The sixth connection electrode CNE6_2 may overlap the light emitting elements ED of the first light emitting element group ED #1 and may electrically contact the first light emitting element group ED #1 exposed through the opening OP formed in the second insulating layer PAS2. Different from the third connection electrode CNE3_2, the sixth connection electrode CNE6_2 may be a third type connection electrode not electrically connected or not directly electrically connected to an electrode or a conductive layer disposed under or below the sixth connection electrode CNE6_2. However, the sixth connection electrode CNE6_2 may further include a third electrode extension part CE3 disposed on the first electrode RME1 and the second electrode RME2 and overlapping the fourth connection electrode CNE4_2 and the fifth connection electrode CNE5_2 disposed under or below the first electrode RME1 and the second electrode RME2. The third electrode extension part CE3 may electrically contact the fourth connection electrode CNE4_2 and the fifth connection electrode CNE5_2 through a plurality of sixth contact parts CT6 penetrating the second insulating layer PAS2.

A current flowing to the first connection electrode CNE1_2 and the second connection electrode CNE2_2 may flow to the sixth connection electrode CNE6_2 through the light emitting elements ED of the first light emitting element group ED #1. The current may flow to the fourth connection electrode CNE4_2 and the fifth connection electrode CNE5_2 through the sixth connection electrode CNE6_2 and may flow to the third connection electrode CNE3_2 through the light emitting elements ED of the second light emitting element group ED #2. The light emitting elements ED of the first light emitting element group ED #1 and the light emitting elements ED of the second light emitting element group ED #2 may be electrically connected to each other through the fourth through sixth connection electrodes CNE4_2, CNE5_2 and CNE6_2 which are third type connection electrodes, and the light emitting elements ED disposed in one subpixel PXn may be partially electrically connected to each other in series.

In the display device 10_2 according to the embodiment, light emitting elements disposed on the same layer may be divided into different light emitting element groups ED #1 and ED #2 and may be electrically connected in series to each other through a third type connection electrode. The display device 10_2 may include light emitting elements ED oriented in different directions, and the light emitting elements ED may form a two-stage series-two-stage parallel connection through a plurality of connection electrodes. Since the display device 10_2 according to the current embodiment further may include the light emitting elements ED electrically connected in series, luminance per unit area can be improved.

Figure 18:
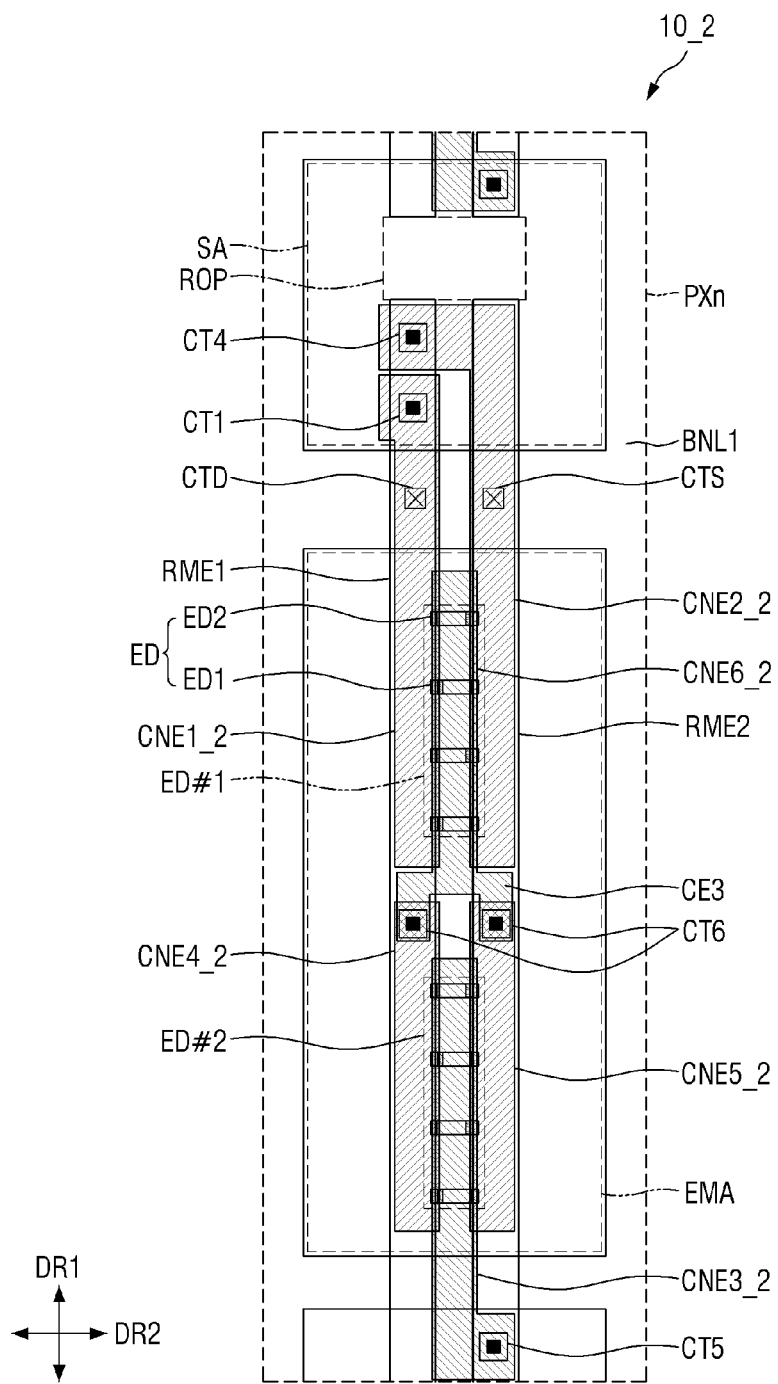
FIG. 18 is a schematic plan view of a subpixel of the display device of FIG. 16 according to an embodiment.

FIG. 18 is a schematic plan view of a subpixel of the display device 10_2 of FIG. 16 according to an embodiment.

Referring to FIG. 18, in the display device 10_2 according to the embodiment, as in the embodiment of FIG. 11, a second electrode RME2 may be electrically connected to a second voltage wiring VL2 through a second electrode contact hole CTS, and a second connection electrode CNE2_2 and a third connection electrode CNE3_2 may be electrically connected to a first electrode RME1 and the second electrode RME2, respectively. The second connection electrode CNE2_2 may be electrically connected to a first transistor T1 through the first electrode RME1, and the third connection electrode CNE3_2 may be electrically connected to the second voltage wiring VL2 through the second electrode RME2. The current embodiment is different from the embodiment of FIG. 16 in that the connection structure of the second electrode RME2 is the same as that in the embodiment of FIG. 11.

The second electrode RME2 may be a first type electrode electrically connected to a fourth conductive layer under or below the second electrode RME2. The second electrode RME2 may electrically contact the second voltage wiring VL2 under or below a via layer VIA through the second electrode contact hole CTS formed in a part overlapping a first bank BNL1.

The second connection electrode CNE2_2 may be disposed on the second electrode RME2 but may be disposed on the first electrode RME1 in a sub area SA. The second connection electrode CNE2_2 may electrically contact the first electrode RME1 through a fourth contact part CT4 penetrating a first insulating layer PAS1 and may be electrically connected to the first transistor T1 through the first electrode RME1.

The third connection electrode CNE3_2 may overlap an area between the first electrode RME1 and the second electrode RME2 and may be electrically connected to the second electrode RME2. The third connection electrode CNE3_2 may be disposed on the second electrode RME2 in the sub area SA. The third connection electrode CNE3_2 may electrically contact the second electrode RME2 through a fifth contact part CT5 penetrating the first insulating layer PAS1 and a second insulating layer PAS2 and may be electrically connected to the second voltage wiring VL2 through the second electrode RME2.

Figure 19:
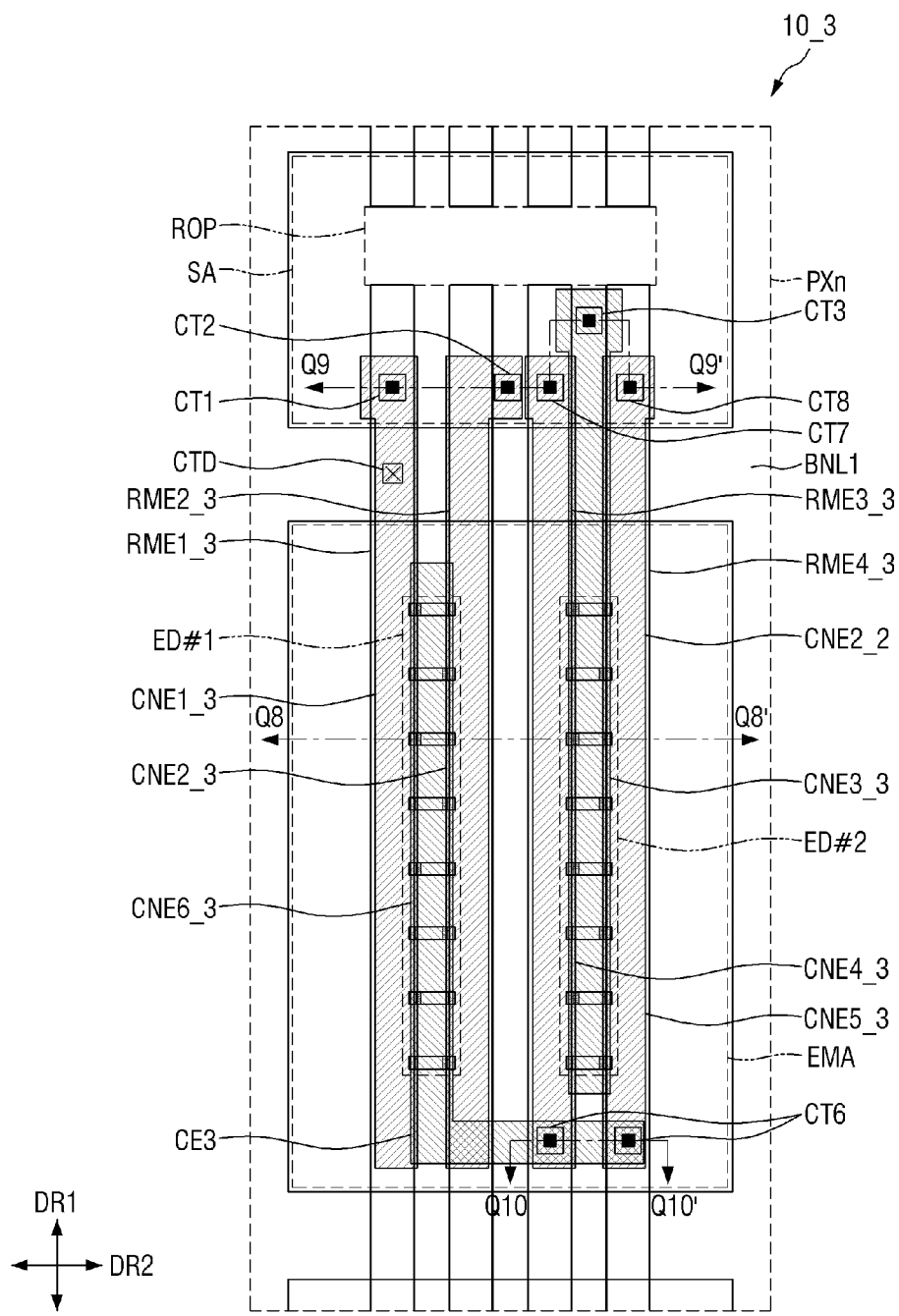
FIG. 19 is a schematic plan view of a subpixel of a display device according to an embodiment.
Figure 20:
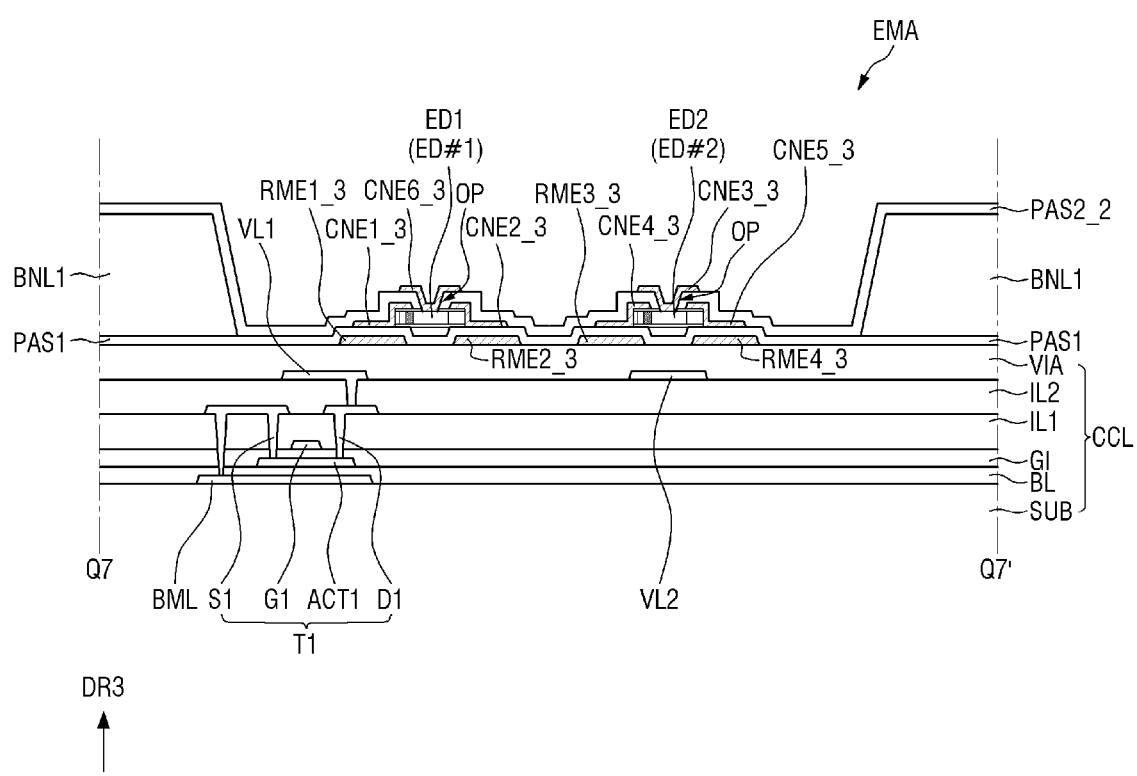
FIG. 20 is a schematic cross-sectional view taken along line Q8-Q8' of FIG. 19.
Figure 21:
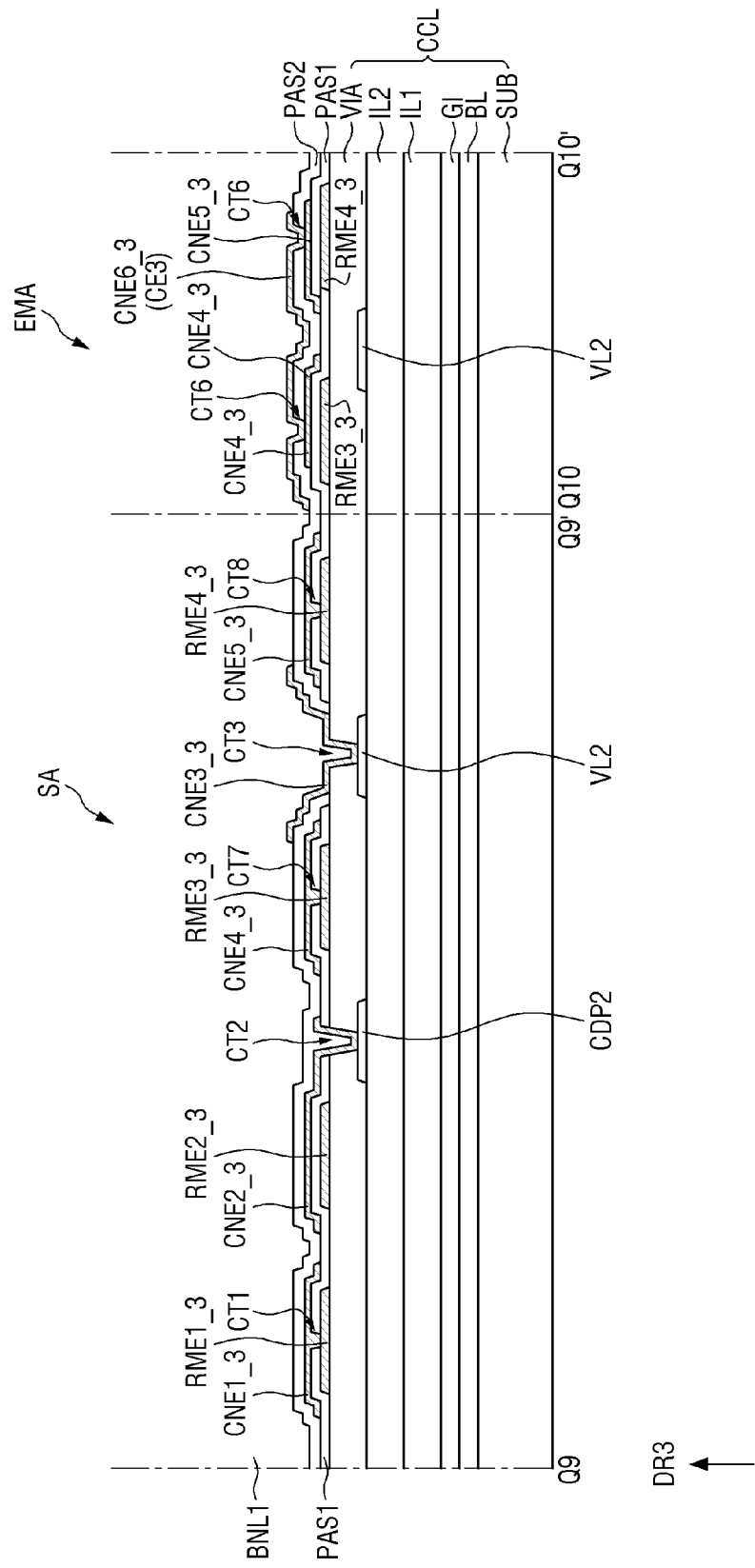
FIG. 21 is a schematic cross-sectional view taken along lines Q9-Q9' and Q10-Q10' of FIG. 19.

FIG. 19 is a schematic plan view of a subpixel of a display device 10_3 according to an embodiment. FIG. 20 is a schematic cross-sectional view taken along line Q8-Q8' of FIG. 19. FIG. 21 is a schematic cross-sectional view taken along lines Q9-Q9' and Q10-Q10' of FIG. 19. FIG. 20 illustrates a schematic cross section across both ends of light emitting elements ED of different light emitting element groups ED #1 and ED #2, and FIG. 21 illustrates a schematic cross section across a plurality of contact parts.

Referring to FIGS. 19 through 21, the display device 10_3 according to the embodiment may include a larger number of electrodes RME and connection electrodes CNE in each subpixel PXn. The number of light emitting elements ED disposed in one subpixel PXn may increase, thereby increasing luminance per unit area. The display device 10_3 according to the current embodiment is different from the embodiment of FIG. 16 in the number of electrodes RME disposed in each subpixel PXn.

The display device 10_3 may include a third electrode RME3_3 and a fourth electrode RME4_3 in addition to a first electrode RME1_3 and a second electrode RME2_3. The third electrode RME3_3 may be spaced apart from the second electrode RME2_3 in the second direction DR2, and the fourth electrode RME4_3 may be spaced apart from the second electrode RME2_3 in the second direction DR2 with the third electrode RME3_3 interposed between them. The third electrode RME3_3 may be spaced apart from the second electrode RME2_3 in the second direction DR2 to face the second electrode RME2_3, and the fourth electrode RME4_3 may be spaced apart from the third electrode RME3_3 in the second direction DR2 to face the third electrode RME3_3. Similar to the first electrode RME1_3 and the second electrode RME2_3, the third electrode RME3_3 and the fourth electrode RME4_3 may extend in the first direction DR1 across an emission area EMA and a sub area SA and may be spaced apart in a separation part ROP from the third electrode RME3_3 and the fourth electrode RME4_3 of another subpixel PXn neighboring in the first direction DR1. Similar to the second electrode RME2_3, the third electrode RME3_3 and the fourth electrode RME4_3 may not be electrically connected or not directly electrically connected to a fourth conductive layer under or below a via layer VIA. However, the third electrode RME3_3 and the fourth electrode RME4_3 may be third type electrodes which electrically contact connection electrodes CNE to be described later.

A plurality of light emitting elements ED may be disposed on the first electrode RME1_3 and the second electrode RME2_3 and on the third electrode RME3_3 and the fourth electrode RME4_3. The light emitting elements ED may be divided into a first light emitting element group ED #1 in which both ends of light emitting elements ED disposed on a first insulating layer PAS1 are disposed on the first electrode RME1_3 and the second electrode RME2_3 and a second light emitting element group ED #2 in which both ends of light emitting elements ED disposed on the first insulating layer PAS1 are disposed on the third electrode RME3_3 and the fourth electrode RME4_3. The light emitting elements ED of each light emitting element group ED #1 or ED #2 may include first light emitting elements ED1 and second light emitting elements ED2 distinguished according to the direction in which first ends face.

A first connection electrode CNE1_3 and a second connection electrode CNE2_3 may be disposed on the first electrode RME1_3 and the second electrode RME2_3, respectively. Their arrangement may be substantially the same as that of the embodiment of FIG. 3. The first connection electrode CNE1_3 and the second connection electrode CNE2_3 may electrically contact both ends of the light emitting elements ED of the first light emitting element group ED #1.

A fourth connection electrode CNE4_3 and a fifth connection electrode CNE5_3 may be disposed on the third electrode RME3_3 and the fourth electrode RME4_3, respectively. The third connection electrode CNE3_3 and the fourth connection electrode CNE4_3 may electrically contact both ends of the light emitting elements ED of the second light emitting element group ED #2. The third connection electrode CNE3_3 and the fourth connection electrode CNE4_3 may be similar to the first connection electrode CNE1_3 and the second connection electrode CNE2_3 in their arrangement but may be different in their connection to electrodes RME under or below them. For example, the fourth connection electrode CNE4_3 may electrically contact the third electrode RME3_3 through a seventh contact part CT7 penetrating the first insulating layer PAS1 in the sub area SA, and the fifth connection electrode CNE5_3 may electrically contact the fourth electrode RME4_3 through an eighth contact part CT8 penetrating the first insulating layer PAS1 in the sub area SA. Different from the second electrode RME2_3, the third electrode RME3_3 and the fourth electrode RME4_3 may not float because they may be electrically connected to the connection electrodes disposed on them.

A third connection electrode CNE3_3 may overlap the light emitting elements ED of the second light emitting element group ED #2 and may electrically contact the second light emitting element group ED #2 exposed through an opening OP formed in a second insulating layer PAS2. The third connection electrode CNE3_3 may extend up to the sub area SA and may electrically contact a second voltage wiring VL2 through a third contact part CT3 formed in the sub area SA.

A sixth connection electrode CNE6_3 may be disposed on the second insulating layer PAS2 and spaced apart from the third connection electrode CNE3_3 in the second direction DR2. The sixth connection electrode CNE6_3 may overlap the light emitting elements ED of the first light emitting element group ED #1 and may electrically contact the first light emitting element group ED #1 exposed through an opening OP formed in the second insulating layer PAS2. Different from the third connection electrode CNE3_3, the sixth connection electrode CNE6_3 may be a third type connection electrode not electrically connected or not directly electrically connected to an electrode or a conductive layer disposed under or below the sixth connection electrode CNE6_3. However, the sixth connection electrode CNE6_3 may include a third electrode extension part CE3 extending in the second direction DR2 in the emission area EMA across the second electrode RME2_3, the third electrode RME3_3 and the fourth electrode RME4_3. The third electrode extension part CE3 may overlap the fourth connection electrode CNE4_3 and the fifth connection electrode CNE5_3 and may electrically contact the fourth connection electrode CNE4_3 and the fifth connection electrode CNE5_3 through a plurality of sixth contact parts CT6 penetrating the second insulating layer PAS2.

As in the embodiment of FIG. 16, the light emitting elements ED of the first light emitting element group ED #1 and the second light emitting element group ED #2 may be electrically connected through the sixth connection electrode CNE6_3, the fourth connection electrode CNE4_3, and the fifth connection electrode CNE5_3. Since the display device 10_3 according to the current embodiment may include a larger number of electrodes RME, a larger number of light emitting elements ED may be disposed, and the light emitting elements ED may form a two-stage series-two-stage parallel connection. In the display device 10_3 including a larger number of light emitting elements ED, luminance per unit area can be improved.

Figure 22:
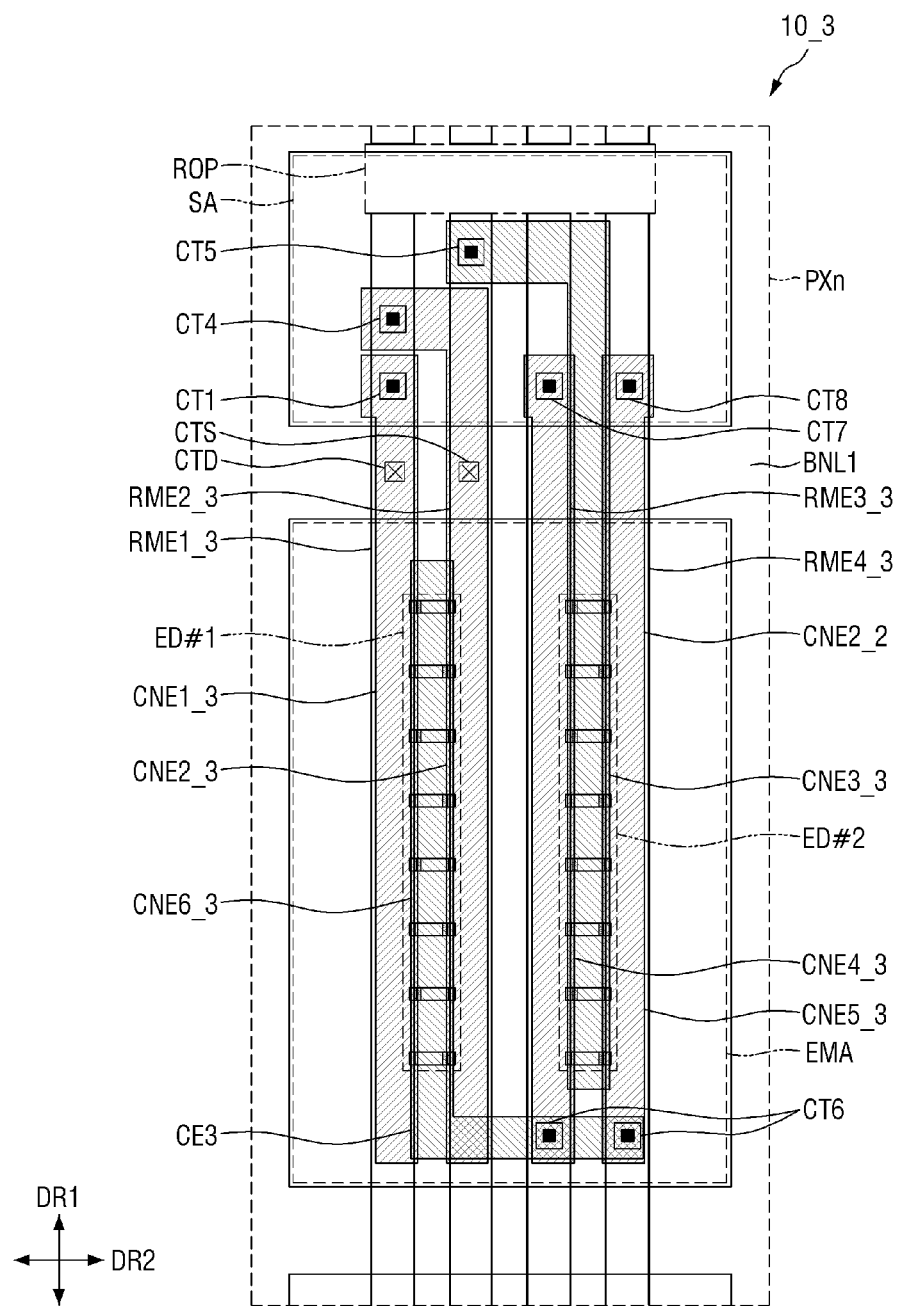
FIG. 22 is a schematic plan view of a subpixel of the display device of FIG. 19 according to an embodiment.

FIG. 22 is a schematic plan view of a subpixel of the display device 10_3 of FIG. 19 according to an embodiment.

Referring to FIG. 22, in the display device 10_3 according to the embodiment, as in the embodiment of FIG. 11, a second electrode RME2_3 may be electrically connected to a second voltage wiring VL2 through a second electrode contact hole CTS, and a second connection electrode CNE2_3 and a third connection electrode CNE3_3 may be electrically connected to a first electrode RME1_3 and the second electrode RME2_3, respectively. The second connection electrode CNE2_3 may be electrically connected to a first transistor T1 through the first electrode RME1_3, and the third connection electrode CNE3_3 may be electrically connected to the second voltage wiring VL2 through the second electrode RME2_3. The current embodiment is different from the embodiment of FIG. 19 in that the connection structure of the second electrode RME2_3 is the same as that in the embodiment of FIG. 11. The arrangement and connection of the second electrode RME2_3, the second connection electrode CNE2_3 and the third connection electrode CNE3_3 are substantially the same as those described above with reference to FIGS. 11 and 18, and thus a detailed description thereof will be omitted.

Figure 23:
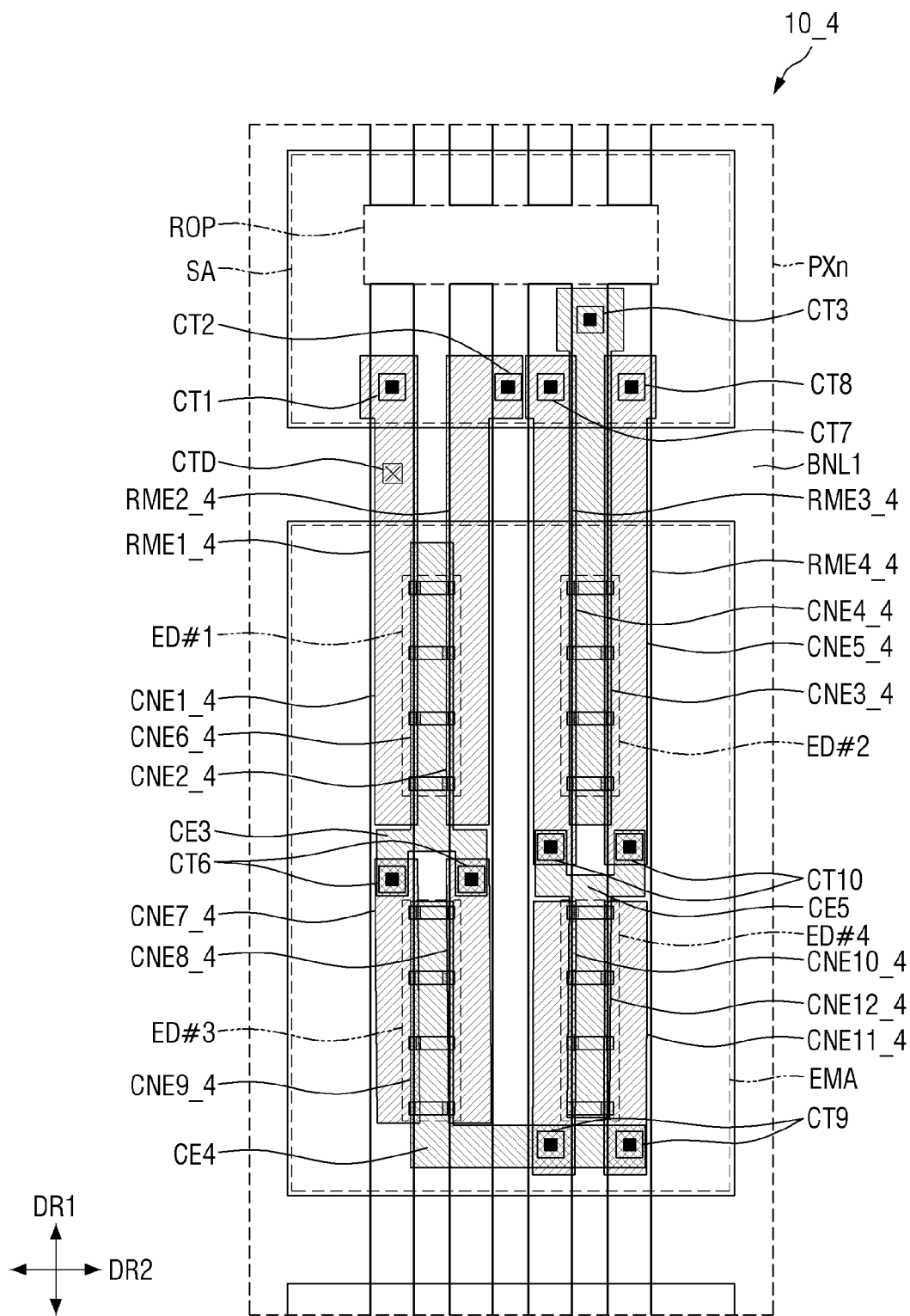
FIG. 23 is a schematic plan view of a subpixel of a display device according to an embodiment.

FIG. 23 is a schematic plan view of a subpixel of a display device 10_4 according to an embodiment.

Referring to FIG. 23, the display device 10_4 according to the embodiment may include a larger number of connection electrodes CNE in each subpixel PXn. Thus, light emitting elements ED of each subpixel PXn may form a four-stage series-two-stage parallel connection. The current embodiment is different from the embodiment of FIG. 18 in the number of connection electrodes CNE disposed in each subpixel PXn of the display device 10_4 and in the series connection between the light emitting elements ED. Any redundant description will be omitted, and the arrangement and connection of the light emitting elements ED and the connection electrodes CNE will be described below.

Compared with the embodiment of FIG. 19, in the display device 10_4 according to the embodiment, light emitting elements ED disposed on a first electrode RME1_4 and a second electrode RME2_4 may be divided into a first light emitting element group ED #1 and a third light emitting element group ED #3, and light emitting elements ED disposed on a third electrode RME3_4 and a fourth electrode RME4_4 may be divided into a second light emitting element group ED #2 and a fourth light emitting element group ED #4.

The connection electrodes CNE may include seventh through twelfth connection electrodes CNE7_4, CNE8_4, CNE9_4, CNE10_4, CNE1_4 and CNE12_4 in addition to first through sixth connection electrodes CNE1_4, CNE2_4, CNE3_4, CNE4_4, CNE5_4 and CNE6_4. The arrangement and connection relationship of the first through sixth connection electrodes CNE1_4, CNE2_4, CNE3_4, CNE4_4, CNE5_4 and CNE6_4 are substantially the same as those of the embodiment of FIG. 18. However, the first through sixth connection electrodes CNE1_4, CNE2_4, CNE3_4, CNE4_4, CNE5_4 and CNE6_4 may be shorter in the first direction DR1 than those of the embodiment of FIG. 18 so that they may electrically contact only the light emitting elements ED of the first light emitting element group ED #1 and the second light emitting element group ED #2. They (for example, the first through sixth connection electrodes CNE_4, CNE2_4, CNE3_4, CNE4_4, CNE5_4 and CNE6_4) will not be described in detail here.

The seventh connection electrode CNE7_4 is disposed on a first insulating layer PAS1 to overlap the first electrode RME1_4. The seventh connection electrode CNE7_4 may be spaced apart from the first connection electrode CNE1_4 in the first direction DR1 and may be a third type connection electrode not electrically connected to electrodes or a conductive layer disposed under or below the seventh connection electrode CNE7_4. The eighth connection electrode CNE8_4 is disposed on the first insulating layer PAS1 to overlap the second electrode RME2_4. The eighth connection electrode CNE8_4 may be spaced apart from the second connection electrode CNE2_4 in the first direction DR1 and may be a third type connection electrode not electrically connected to electrodes or a conductive layer disposed under or below the eighth connection electrode CNE8_4. The seventh connection electrode CNE7_4 and the eighth connection electrode CNE8_4 may respectively electrically contact both ends of the light emitting elements ED of the third light emitting element group ED #3. The seventh connection electrode CNE7_4 and the eighth connection electrode CNE8_4 may electrically contact a third electrode extension part CE3 of the sixth connection electrode CNE6_4 through sixth contact parts CT6.

The ninth connection electrode CNE9_4 may be disposed on a second insulating layer PAS2 and spaced apart from the sixth connection electrode CNE6_4 in the first direction DR1. The ninth connection electrode CNE9_4 may overlap the light emitting elements ED of the third light emitting element group ED #3 and may electrically contact the third light emitting element group ED #3 exposed though an opening OP formed in the second insulating layer PAS2. Different from the third connection electrode CNE3_4, the ninth connection electrode CNE9_4 may be a third type connection electrode not electrically connected or not directly electrically connected to an electrode or a conductive layer disposed under or below the ninth connection electrode CNE9_4. However, the ninth connection electrode CNE9_4 may include a fourth electrode extension part CE4 extending in the second direction DR2 in an emission area EMA across the second electrode RME2_4, the third electrode RME3_4 and the fourth electrode RME4_4. The fourth electrode extension part CE4 may overlap the tenth connection electrode CNE10_4 and the eleventh connection electrode CNE11_4 to be described later and may electrically contact the tenth connection electrode CNE10_4 and the eleventh connection electrode CNE11_4 through a plurality of ninth contact parts CT9 penetrating the second insulating layer PAS2.

The tenth connection electrode CNE10_4 is disposed on the first insulating layer PAS1 to overlap the third electrode RME3_4. The tenth connection electrode CNE10_4 may be spaced apart from the fourth connection electrode CNE4_4 in the first direction DR1 and may be a third type connection electrode not electrically connected to electrodes or a conductive layer disposed under or below the tenth connection electrode CNE10_4. The eleventh connection electrode CNE11_4 is disposed on the first insulating layer PAS1 to overlap the fourth electrode RME4_4. The eleventh connection electrode CNE11_4 may be spaced apart from the fifth connection electrode CNE5_4 in the first direction DR1 and may be a third type connection electrode not electrically connected to electrodes or a conductive layer disposed under or below the eleventh connection electrode CNE11_4. The tenth connection electrode CNE10_4 and the eleventh connection electrode CNE11_4 may respectively electrically contact both ends of the light emitting elements ED of the fourth light emitting element group ED #4. The tenth connection electrode CNE10_4 and the eleventh connection electrode CNE11_4 may electrically contact the fourth electrode extension part CE4 of the ninth connection electrode CNE9_4 through the ninth contact parts CT9.

The twelfth connection electrode CNE12_4 may be disposed on the second insulating layer PAS2 and spaced apart from the third connection electrode CNE3_4 in the first direction DR1. The twelfth connection electrode CNE12_4 may overlap the light emitting elements ED of the fourth light emitting element group ED #4 and may electrically contact the fourth light emitting element group ED #4 exposed through an opening OP formed in the second insulating layer PAS2. Different from the third connection electrode CNE3_4, the twelfth connection electrode CNE12_4 may be a third type connection electrode not electrically connected or not directly electrically connected to an electrode or a conductive layer disposed under or below the twelfth connection electrode CNE12_4. However, the twelfth connection electrode CNE12_4 may include a fifth electrode extension part CE5, and the fifth electrode extension part CE5 may overlap the fourth connection electrode CNE4_4 and the fifth connection electrode CNE5_4. The fifth electrode extension part CE5 may electrically contact the fourth connection electrode CNE4_4 and the fifth connection electrode CNE5_4 through a plurality of tenth contact parts CT10 penetrating the second insulating layer PAS2.

In the display device 10_4, the light emitting elements ED may be divided into a larger number of light emitting element groups ED #1 through ED #4 and may be electrically connected in series to each other. Accordingly, the light emitting elements ED of the display device 10_4 may form a four-stage series-two-stage parallel connection, thereby further improving the luminance of each subpixel PXn.

Figure 24:
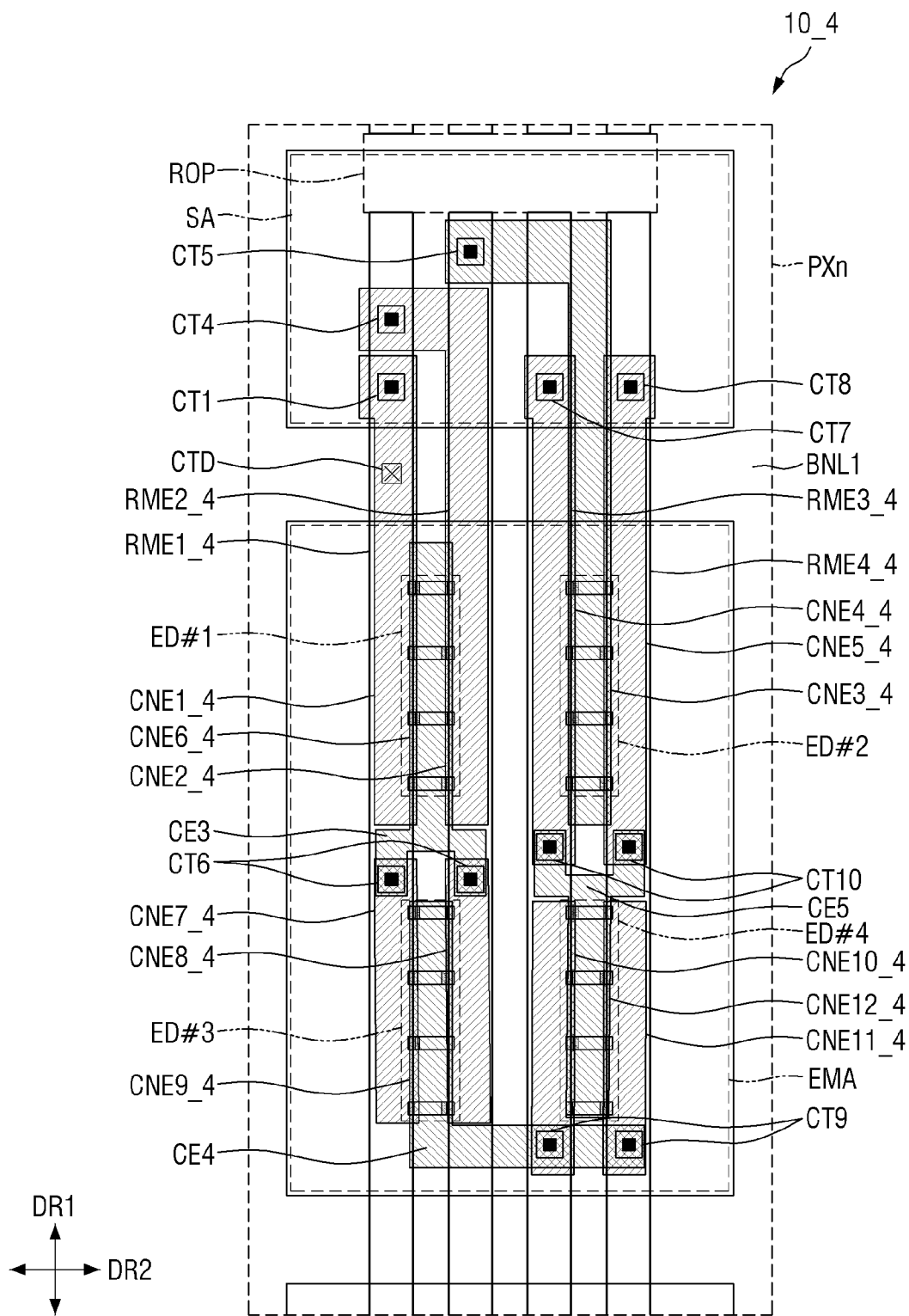
FIG. 24 is a schematic plan view of a subpixel of the display device of FIG. 23 according to an embodiment.

FIG. 24 is a schematic plan view of a subpixel of the display device 10_4 of FIG. 23 according to an embodiment.

Figure 25:
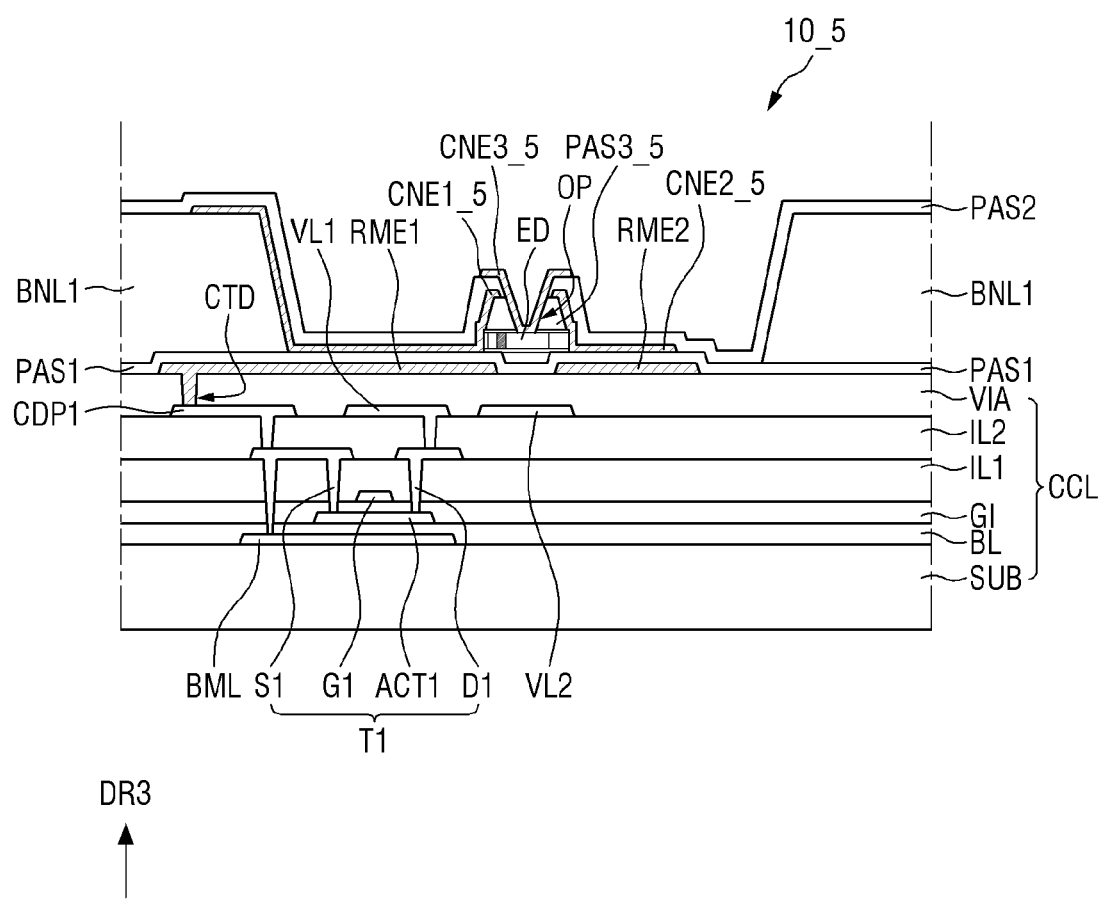
FIG. 25 is a schematic cross-sectional view of a part of a display device according to an embodiment.

Referring to FIG. 24, in the display device 10_4 according to the embodiment, as in the embodiment of FIG. 11, a second electrode RME2_4 may be electrically connected to a second voltage wiring VL2 through a second electrode contact hole CTS, and a second connection electrode CNE2_4 and a third connection electrode CNE3_4 may be electrically connected to a first electrode RME1_4 and the second electrode RME2_4, respectively. The second connection electrode CNE2_4 may be electrically connected to a first transistor T1 through the first electrode RME1_4, and the third connection electrode CNE3_4 may be electrically connected to the second voltage wiring VL2 through the second electrode RME2_4. The current embodiment is different from the embodiment of FIG. 23 in that the connection structure of the second electrode RME2_4 is the same as that in the embodiment of FIG. 11. The arrangement and connection of the second electrode RME2_4, the second connection electrode CNE2_4 and the third connection electrode CNE3_4 are substantially the same as those described above with reference to FIGS. 11 and 18, and thus a detailed description thereof will be omitted. FIG. 25 is a schematic cross-sectional view of a part of a display device 10_5 according to an embodiment.

Referring to FIG. 25, the display device 10_5 according to the embodiment may further include an insulating layer which fixes the alignment positions of light emitting elements ED during a manufacturing process. The display device 10_5 may further include a third insulating layer PAS3_5 disposed on a plurality of light emitting elements ED. The third insulating layer PAS3_5 may partially cover or overlap the light emitting elements ED (ED1 and ED2) before a process of forming a first connection electrode CNE1 and a second connection electrode CNE2. The third insulating layer PAS3_5 may prevent the light emitting elements ED from moving out of place during the process of forming the connection electrodes CNE.

The third insulating layer PAS3_5 may be disposed on parts of a first insulating layer PAS1 and the light emitting elements ED. For example, the third insulating layer PAS3_5 may partially cover or overlap outer surfaces of the light emitting elements ED and may not cover or overlap both ends of the light emitting elements ED. A part of the third insulating layer PAS3_5 which is disposed on the light emitting elements ED may extend in the first direction DR1 on the first insulating layer PAS1 in a plan view to form a linear or island pattern in each subpixel PXn. The third insulating layer PAS3_5 may protect the light emitting elements ED (ED1 and ED2) while fixing the positions of the light emitting elements ED in the manufacturing process of the display device 10_5.

The first connection electrode CNE1_5 and the second connection electrode CNE2_5 may be spaced apart from each other on the third insulating layer PAS3_5. The first connection electrode CNE1_5 may electrically contact first ends of first light emitting elements ED1 and second ends of second light emitting elements ED2, and a part of the first connection electrode CNE1_5 may be disposed on the third insulating layer PAS3_5. The second connection electrode CNE2_5 may electrically contact second ends of the first light emitting elements ED1 and first ends of the second light emitting elements ED2, and a part of the second connection electrode CNE2_5 may be disposed on the third insulating layer PAS3_5. The first connection electrode CNE1_5 and the second connection electrode CNE2_5 may be spaced apart from each other in the second direction DR2 on a part of the third insulating layer PAS3_5 which covers or overlaps the light emitting elements ED.

A third connection electrode CNE3_5 may be disposed on a second insulating layer PAS2 and the third insulating layer PAS3_5 to overlap the light emitting elements ED. An opening OP formed in the second insulating layer PAS2 may also penetrate the third insulating layer PAS3_5 to expose side surfaces of the light emitting elements ED, and the third connection electrode CNE3_5 may partially electrically contact the side surfaces of the light emitting elements ED exposed through the opening OP.

Figure 26:
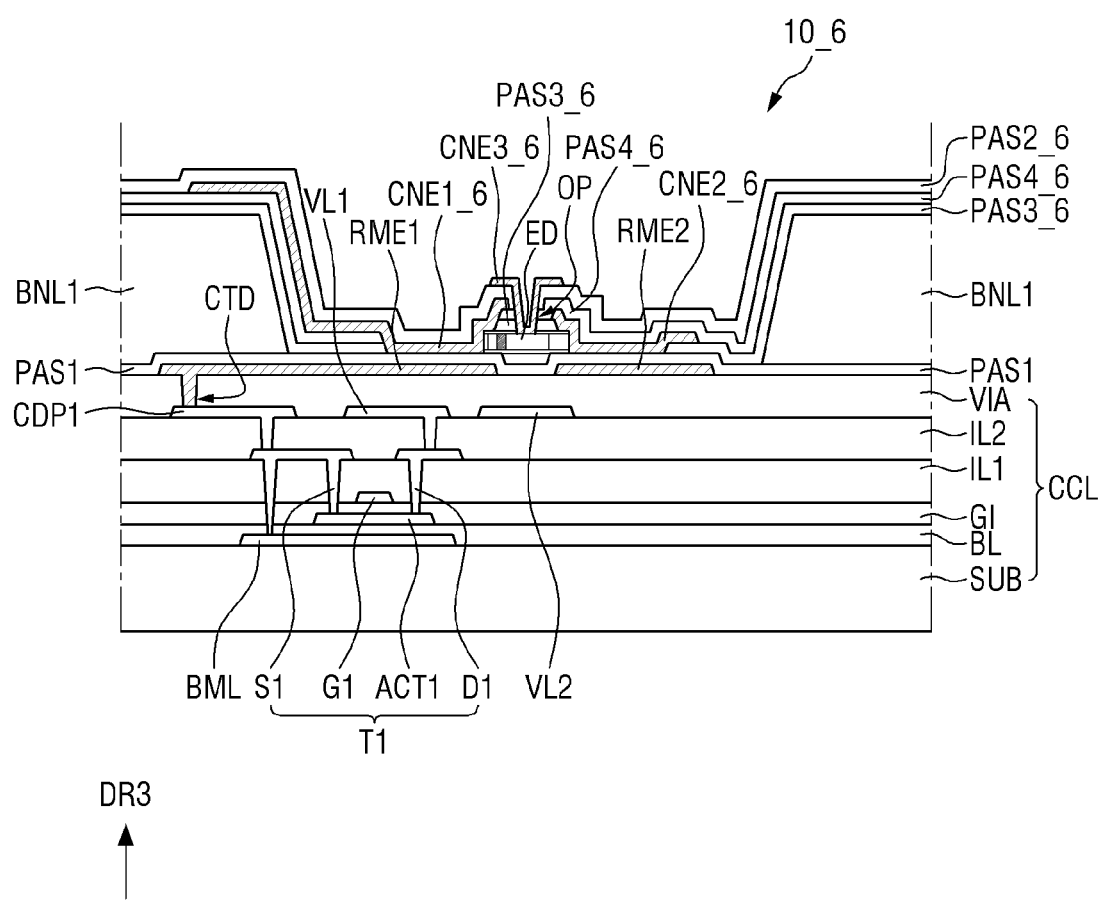
FIG. 26 is a schematic cross-sectional view of a part of a display device according to an embodiment.

FIG. 26 is a schematic cross-sectional view of a part of a display device 10_6 according to an embodiment.

Referring to FIG. 26, in the display device 10_6 according to the embodiment, a first connection electrode CNE1_6 and a second connection electrode CNE2_6 may be disposed on different layers, and an insulating layer may be further disposed between them. The current embodiment is different from the embodiment of FIG. 25 in that the display device 10_6 may include more insulating layers.

A fourth insulating layer PAS4_6 may be disposed on a first insulating layer PAS1, a third insulating layer PAS3_6, and the second connection electrode CNE2_6. The fourth insulating layer PAS4_6 may be entirely disposed on the first insulating layer PAS1 and the third insulating layer PAS3_5 but may expose an end of each light emitting element ED on which the first connection electrode CNE1_6 is disposed. A part of the first connection electrode CNE1_6 may be disposed on the fourth insulating layer PAS4_6, and the first connection electrode CNE1_6 and the second connection electrode CNE2_6 may be insulated from each other by the fourth insulating layer PAS4_6.

A third connection electrode CNE3_6 may be disposed on a second insulating layer PAS2_6, the third insulating layer PAS3_6 and the fourth insulating layer PAS4_6 to overlap the light emitting elements ED. An opening OP formed in the second insulating layer PAS2_6 may also penetrate the third insulating layer PAS3_6 and the fourth insulating layer PAS4_6 to expose side surfaces of the light emitting elements ED, and the third connection electrode CNE3_6 may partially electrically contact the side surfaces of the light emitting elements ED exposed through the opening OP.

In the above embodiments, the first connection electrode CNE1 and the second connection electrode CNE2 may be formed in the same process, and the third connection electrode CNE3 may be formed in another process. However, in the display device 10_6 according to the current embodiment, since at least one insulating layer is disposed between the first connection electrode CNE1_6 and the second connection electrode CNE2_6, the first connection electrode CNE1_6 and the second connection electrode CNE2_6 may be formed in different processes. For example, if the third insulating layer PAS3_6 is formed after the light emitting elements ED are placed, the second connection electrode CNE2_6 is formed first, and then the fourth insulating layer PAS4_6 and the first connection electrode CNE1_6 may be sequentially formed. In the display device 10_6, since the connection electrodes CNE1_6, CNE2_6 and CNE3_6 are insulated from each other by insulating layers (for example, the second insulating layer PAS2_6, the third insulating layer PAS3_6 and the fourth insulating layer PAS4_6), it is possible to prevent a short circuit problem due to residues of connection electrode materials in a manufacturing process.

Figure 27:
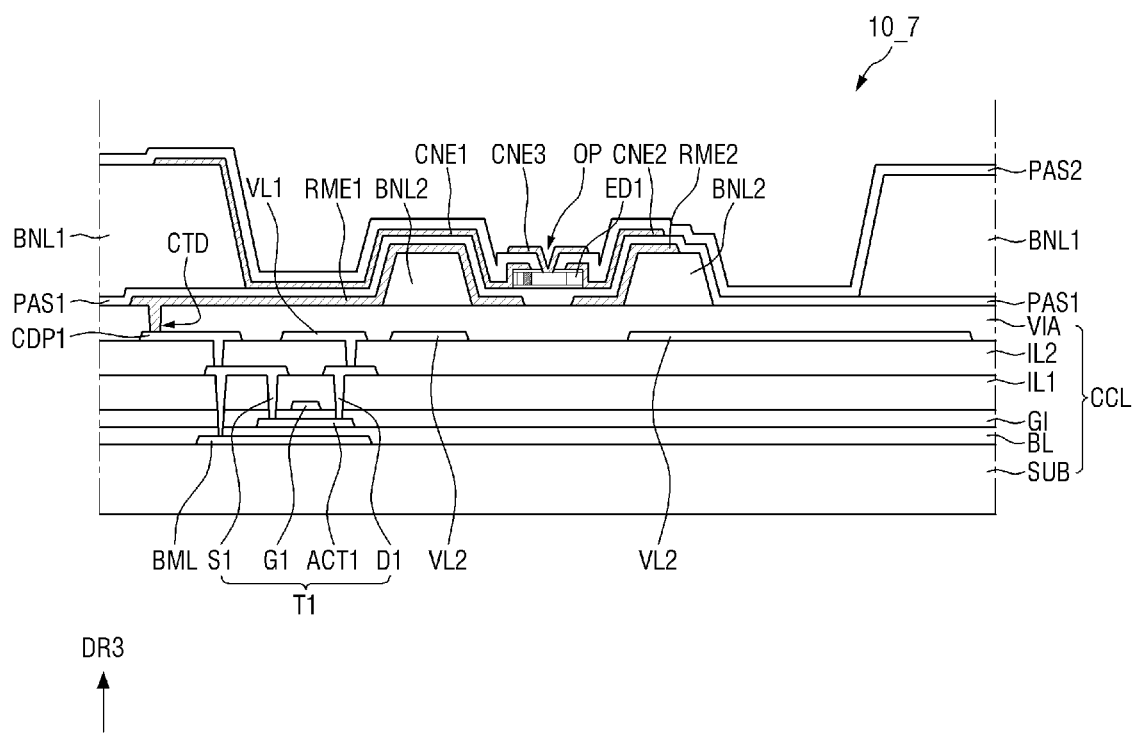
FIG. 27 is a schematic cross-sectional view of a part of a display device according to an embodiment.

FIG. 27 is a schematic cross-sectional view of a part of a display device 10_7 according to an embodiment.

Referring to FIG. 27, the display device 10_7 according to the embodiment may further include a plurality of second banks BNL2 disposed between electrodes RME (RME1 and RME2) and a via layer VIA. Parts of the electrodes RME (RME1 and RME2) which are disposed in an emission area EMA may be disposed on the second banks BNL2, and light emitting elements ED (ED1 and ED2) may be disposed between the second banks BNL2 spaced apart from each other. The display device 10_7 of the current embodiment is different from the embodiment of FIG. 4 in that it further may include the second banks BNL2 disposed under or below the electrodes RME.

The second banks BNL2 may be disposed on or directly disposed on the via layer VIA. The second banks BNL2 may extend in the first direction DR1 in the center of the emission area EMA. In the display device 10_7, a plurality of second banks BNL2 may be disposed in each subpixel PXn and may be spaced apart from each other. For example, the second banks BNL2 may be spaced apart from each other in the second direction DR2 in each emission area EMA. A first electrode RME1 and a second electrode RME2 may be disposed on different second banks BNL2, respectively.

Lengths of the second banks BNL2 in the first direction DR1 may be smaller than a length of an area surrounded by a first bank BNL1 in the first direction DR1. For example, the second banks BNL2 may be disposed in the emission area EMA of each subpixel PXn to form island patterns having a relatively small width and extending in a direction in the entire display area DPA.

At least a part of each of the second banks BNL2 may protrude from an upper surface of the via layer VIA. The protruding part of each second bank BNL2 may have inclined side surfaces. However, the disclosure is not limited thereto, and each of the second banks BNL2 may also have a substantially semicircular or substantially semielliptical shape having a substantially curved outer surface. The second banks BNL2 may include, but are not limited to, an organic insulating material such as polyimide (PI).

In an embodiment, widths of the first electrode RME1 and the second electrode RME2 measured in the second direction DR2 may be smaller than those of the second banks BNL2.

Each of the first electrode RME1 and the second electrode RME2 may cover or overlap only one side or a side surface of a second bank BNL2. However, the disclosure is not limited thereto, and the widths of the electrodes RME measured in the second direction DR2 may also be greater than those of the second banks BNL2, and each of the electrodes RME may cover or overlap both side surfaces of a second bank BNL2. Each of the electrodes RME may cover or overlap at least one side or a side surface of a second bank BNL2 to reflect light emitted from the light emitting elements ED.

A gap between the electrodes RME in the second direction DR2 may be smaller than a gap between the second banks BNL2. Even if the display device 10_7 further may include the second banks BNL2, at least a part of each electrode RME may be disposed on or directly disposed on the via layer VIA. Thus, the electrodes RME may be coplanar.

In an embodiment, each of the first electrode RME1 and the second electrode RME2 may cover or overlap at least one side or a side surface of a second bank BNL2. The second banks BNL2 may have a predetermined height and have inclined or curved side surfaces, and the light emitting elements ED are disposed between the second banks BNL2 spaced apart in the second direction DR2. Light generated by the light emitting elements ED may be emitted toward both ends of the light emitting elements ED and may travel toward the electrodes RME disposed on the side surfaces of the second banks BNL2. As described above, the electrodes RME may include a material having high reflectivity, and light emitted from the light emitting elements ED may be reflected by the electrodes RME toward above the via layer VIA. Since the display device 10_8 further may include the second banks BNL2 disposed between the via layer VIA and the electrodes RME, front emission efficiency can be improved.

Figure 28:
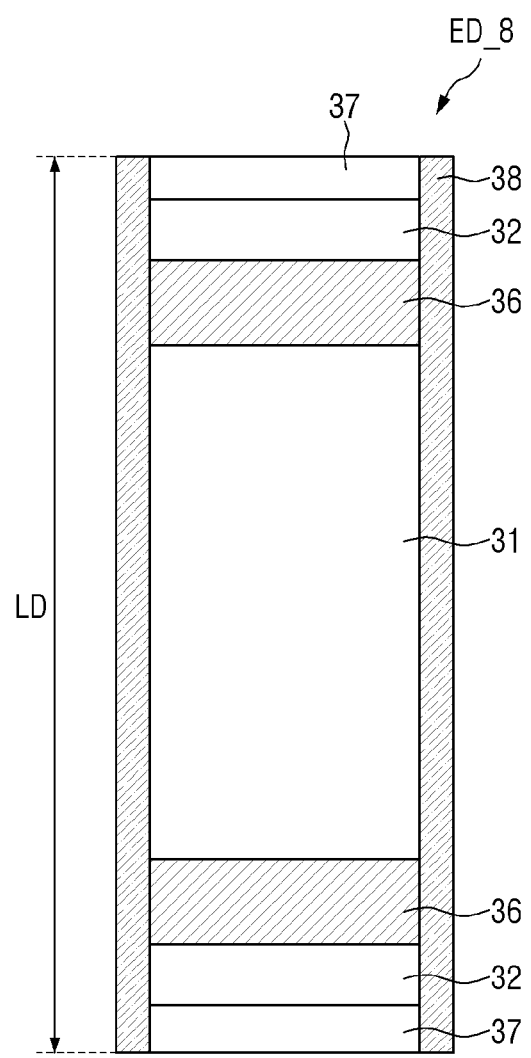
FIG. 28 is a schematic cross-sectional view of a light emitting element according to an embodiment.
Figure 29:
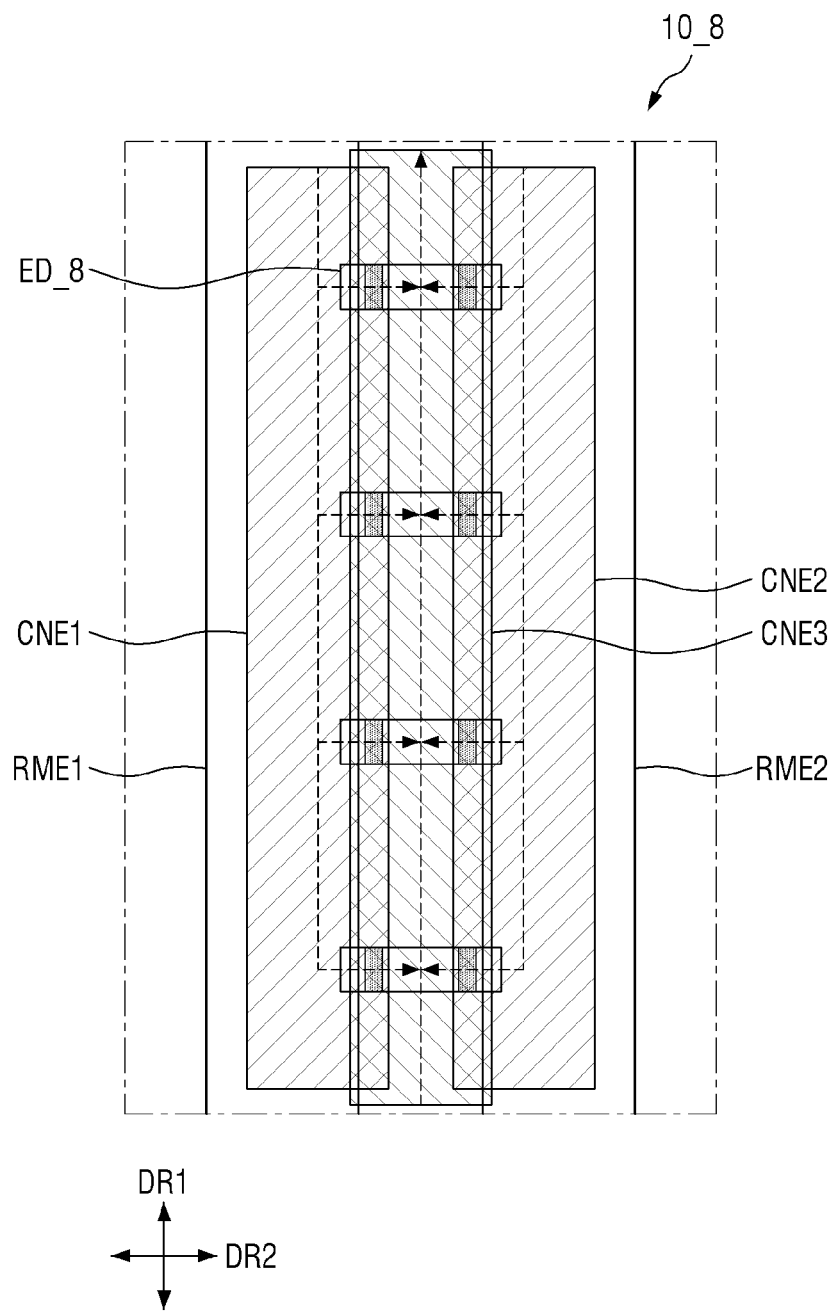
FIG. 29 is a schematic plan view of a part of a display device including the light emitting element of FIG. 28.

FIG. 28 is a schematic cross-sectional view of a light emitting element ED_8 according to an embodiment. FIG. 29 is a schematic plan view of a part of a display device 10_8 including the light emitting element ED_8 of FIG. 28.

Referring to FIGS. 28 and 29, the light emitting element ED_8 according to the embodiment may not include a third semiconductor layer 33 and may include one first semiconductor layer 31, a plurality of light emitting layers 36, a plurality of second semiconductor layers 32, and a plurality of electrode layers 37. In the light emitting element ED_8, the first semiconductor layer 31 may be disposed in the middle in the longitudinal direction, and the light emitting layers 36, the second semiconductor layers 32 and the electrode layers 37 may be sequentially disposed at both ends in the longitudinal direction. The light emitting element ED_8 may extend in one direction, and a plurality of semiconductor layers of the light emitting element ED_8 may be disposed symmetrically with respect to the first semiconductor layer 31. Although the electrode layers 37 are respectively disposed at both ends of the light emitting element ED_8 in the drawings, the disclosure is not limited thereto, and at least any one electrode layer 37 can be omitted.

As in the embodiment of FIGS. 7 and 10, in the light emitting element ED disposed in the display device 10, the third connection electrode CNE3 and the first semiconductor layer 31 may be electrically connected to each other in the middle in the longitudinal direction, and both ends may be electrically connected to the first connection electrode CNE1 and the second connection electrode CNE2, respectively. A current flowing to the third connection electrode CNE3 may flow to one of the both ends at which the second semiconductor layer 32 or the electrode layer 37 is disposed so that the light emitting layer 36 can emit light, and no current may flow to the other end at which the third semiconductor layer 33 is disposed. However, as in the embodiment of FIG. 28, if the light emitting element ED_8 may include a plurality of light emitting layers 36, and thus the second semiconductor layers 32 or the electrode layers 37 are disposed at both ends of the first semiconductor layer 31, respectively, a current flowing to the first semiconductor layer 31 through a third connection electrode CNE3 may flow to both ends, causing the light emitting layers 36 to emit light.

As illustrated in FIG. 29, the display device 10_8 according to the embodiment may include light emitting elements ED_8, each including a plurality of light emitting layers 36, and a current may flow regardless of orientation directions of the light emitting elements ED_8. In each light emitting element ED_8, the first semiconductor layer 31 may be electrically connected to the third connection electrode CNE3, and each of the electrode layers 37 or the second semiconductor layers 32 disposed at both ends may be electrically connected to a first connection electrode CNE1 or a second connection electrode CNE2. Of the both ends of each light emitting element ED_8, a first end disposed on a first electrode RME1 may be electrically connected to the first connection electrode CNE1, and a second end disposed on a second electrode RME2 may be electrically connected to the second connection electrode CNE2.

Different from an embodiment of FIGS. 7 and 10, the second semiconductor layers 32 which are p-type semiconductor layers are disposed at both ends of each light emitting element ED_8, and a light emitting layer 36 is disposed between the first semiconductor layer 31 and each of the second semiconductor layers 32. A current flowing from the first connection electrode CNE1 and the second connection electrode CNE2 may flow to the first semiconductor layer 31 through the second semiconductor layers 32 and the light emitting layers 36 of each light emitting element ED_8, and most of the light emitting elements ED_8 of the display device 108 may emit light. Since the display device 10_8 according to the embodiment may include the light emitting elements ED_8, each including a plurality of light emitting layers 36, it can emit light regardless of the orientation directions of the light emitting elements ED_8 and the direction of current flow. Accordingly, the amount of light emission per unit area of a subpixel PXn may increase.

A light emitting element according to an embodiment may include an undoped semiconductor layer. Thus, a current may flow in a specific or selected direction.

A display device may include the above light emitting element and a plurality of connection electrodes electrically connected to different semiconductor layers of the light emitting element. In a display device according to an embodiment, light emitting elements can be made to emit light regardless of orientation directions of the light emitting elements, and the number of light emitting elements that cannot emit light per unit area can be minimized, thereby improving the yield of a manufacturing process.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
a first electrode and a second electrode disposed on a substrate and spaced apart from each other;
a first insulating layer disposed on the first electrode and the second electrode;
light emitting elements disposed on the first insulating layer, each of the light emitting elements having plurality of semiconductor lavers an insulating film surrounding the plurality of semiconductor layers, a first end disposed on the first electrode and a second end disposed on the second electrode;
a first connection electrode disposed on the first electrode and electrically contacting the first end of each of the light emitting elements;
a second connection electrode disposed on the second electrode and electrically contacting the second end of each of the light emitting elements;
a second insulating layer disposed on the light emitting elements, the first connection electrode and the second connection electrode; and
a third connection electrode disposed on the second insulating layer and electrically contacting a semiconductor layer of the light emitting elements through both an opening in the insulating film spaced apart from the first end and the second end and an opening formed in the second insulating layer that partially exposes the light emitting elements.

2. The display device of claim 1, wherein
the first connection electrode electrically contacts an end surface of each of the light emitting elements,
the second connection electrode electrically contacts another end surface of each of the light emitting elements, and
the third connection electrode electrically contacts a side surface of each of the light emitting elements.

3. The display device of claim 2, wherein the light emitting elements comprise:
first light emitting elements having first ends disposed on the first electrode and second ends disposed on the second electrode; and
second light emitting elements having first ends disposed on the second electrode and second ends disposed on the first electrode.

4. The display device of claim 1, wherein
the third connection electrode electrically contacts the semiconductor layer of the plurality of semiconductor layers at the opening of the insulating film, which is located at a side of each of the light emitting elements.

5. The display device of claim 4, wherein
each of the light emitting elements comprises:
a first semiconductor layer;
a second semiconductor layer disposed on the first semiconductor layer;
a light emitting layer disposed between the first semiconductor layer and the second semiconductor layer; and
a third semiconductor layer disposed on a surface of the first semiconductor layer opposite a surface facing the light emitting layer, and the third connection electrode electrically contacts the first semiconductor layer.

6. The display device of claim 5, wherein each of the light emitting elements further comprises a fourth semiconductor layer disposed between a portion in which the first semiconductor layer electrically contacts the third connection electrode and an end surface on which the third semiconductor layer is disposed.

7. The display device of claim 1, further comprising:
a conductive layer disposed on the substrate; and
a via layer disposed on the conductive layer, wherein
the first electrode electrically contacts a first conductive pattern of the conductive layer through a first electrode contact hole penetrating the via layer, and
the first connection electrode electrically contacts the first electrode through a first contact part penetrating the first insulating layer.

8. The display device of claim 7, wherein
the second connection electrode electrically contacts a second conductive pattern of the conductive layer through a second contact part penetrating the via layer and the first insulating layer, and
the third connection electrode electrically contacts a voltage wiring of the conductive layer through a third contact part penetrating the via layer, the first insulating layer and the second insulating layer.

9. The display device of claim 7, wherein
the second electrode electrically contacts a voltage wiring of the conductive layer through a second electrode contact hole penetrating the via layer,
the second connection electrode electrically contacts the first electrode through a fourth contact part penetrating the first insulating layer, and
the third connection electrode electrically contacts the second electrode through a fifth contact part penetrating the first insulating layer and the second insulating layer.

10. The display device of claim 1, further comprising:
a fourth connection electrode disposed on the first electrode between the first insulating layer and the second insulating layer and electrically contacting the light emitting elements;
a fifth connection electrode disposed on the second electrode between the first insulating layer and the second insulating layer and electrically contacting the light emitting elements; and
a sixth connection electrode disposed on the second insulating layer and electrically contacting the light emitting elements, wherein
the fourth connection electrode is spaced apart from the first connection electrode,
the fifth connection electrode is spaced apart from the second connection electrode, and
the sixth connection electrode is spaced apart from the third connection electrode.

11. The display device of claim 10, wherein
the third connection electrode overlaps the light emitting elements that electrically contact the fourth connection electrode and the fifth connection electrode,
the sixth connection electrode overlaps the light emitting elements that electrically contact the first connection electrode and the second connection electrode, and
the sixth connection electrode electrically contacts the fourth connection electrode and the fifth connection electrode through sixth contact parts penetrating the second insulating layer.

12. The display device of claim 1, further comprising:
a third electrode and a fourth electrode disposed on the substrate and spaced apart from each other;
a fourth connection electrode disposed on the third electrode;
a fifth connection electrode disposed on the fourth electrode; and
a sixth connection electrode disposed on the second insulating layer, wherein
the light emitting elements comprise:
a first light emitting element group disposed on the first electrode and the second electrode; and
a second light emitting element group disposed on the third electrode and the fourth electrode,
the third connection electrode electrically contacts the second light emitting element group, and
the sixth connection electrode electrically contacts the first light emitting element group.

13. The display device of claim 12, wherein
the sixth connection electrode further comprises an electrode extension part disposed across the second electrode, the third electrode and the fourth electrode, and
the electrode extension part electrically contacts the fourth connection electrode and the fifth connection electrode through sixth contact parts penetrating the second insulating layer.

14. The display device of claim 1, further comprising a third insulating layer disposed between the light emitting elements and the second insulating layer, wherein
a portion of each of the first connection electrode and the second connection electrode is disposed on the third insulating layer, and
the opening of the second insulating layer penetrates the third insulating layer to expose the light emitting elements.

15. The display device of claim 14, further comprising a fourth insulating layer disposed between the second connection electrode and the second insulating layer, wherein
a portion of the first connection electrode is disposed on the fourth insulating layer, and
the opening of the second insulating layer penetrates the fourth insulating layer to expose the light emitting elements.

* * * * *